(12) United States Patent
Nguyen

(10) Patent No.: US 7,236,557 B1
(45) Date of Patent: Jun. 26, 2007

(54) COUNTER-BASED CLOCK MULTIPLIER CIRCUITS AND METHODS

(75) Inventor: Andy T. Nguyen, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 128 days.

(21) Appl. No.: 11/179,273

(22) Filed: Jul. 12, 2005

Related U.S. Application Data

(63) Continuation-in-part of application No. 11/058,043, filed on Feb. 15, 2005, now Pat. No. 7,139,361, which is a continuation-in-part of application No. 10/651,811, filed on Aug. 29, 2003, now Pat. No. 6,906,562, which is a continuation-in-part of application No. 10/618,329, filed on Jul. 11, 2003, now Pat. No. 7,005,900.

(51) Int. Cl.
*H03K 21/00* (2006.01)
*H03K 23/00* (2006.01)

(52) U.S. Cl. .......................................... 377/47; 327/116

(58) Field of Classification Search ................ None
See application file for complete search history.

(56) References Cited

U.S. PATENT DOCUMENTS

| | | | |
|---|---|---|---|
| 3,952,253 A | 4/1976 | DeVolpi et al. | |
| 4,017,719 A | 4/1977 | Kaplan et al. | |
| 4,290,022 A | 9/1981 | Puckette | |
| 5,109,395 A | 4/1992 | Tanaka | |
| 5,744,992 A | 4/1998 | Baumann | |
| 5,898,329 A | 4/1999 | Hopkins | |
| 6,023,199 A | 2/2000 | Cheung | |
| 6,107,846 A * | 8/2000 | Shinmori | 327/116 |
| 6,259,283 B1 | 7/2001 | Nguyen | |
| 6,285,226 B1 | 9/2001 | Nguyen | |
| 6,351,756 B1 | 2/2002 | Taniyoshi | |
| 6,426,660 B1 | 7/2002 | Ho et al. | |
| 6,788,120 B1 | 9/2004 | Nguyen | |
| 6,906,562 B1 | 6/2005 | Nguyen | |
| 6,906,571 B1 | 6/2005 | Nguyen | |
| 6,914,459 B2 * | 7/2005 | Konuk et al. | 327/116 |
| 6,924,684 B1 | 8/2005 | Nguyen | |
| 7,005,900 B1 | 2/2006 | Nguyen | |

* cited by examiner

*Primary Examiner*—Tuan T. Lam
(74) *Attorney, Agent, or Firm*—Lois D. Cartier

(57) ABSTRACT

Clock multiplier circuits and methods use counters to define the positions of the output clock edges. A plurality of counters are each clocked by a count clock relatively much faster than the input clock. A first counter counts for one input clock period, and the counted value is stored. The stored value is then divided and the divided values are combined to provide counter stop values representing the numbers of counts in various fractions of the input clock period. A second counter counts from an initial value starting from a first edge of the input clock, and the count is compared in turn to the each of the counter stop values. When the value in the second counter matches one of the counter stop values, a pulse is generated on the output clock signal. Thus, the second counter generates a series of pulses at predetermined times in the input clock period.

20 Claims, 29 Drawing Sheets

FIG. 34
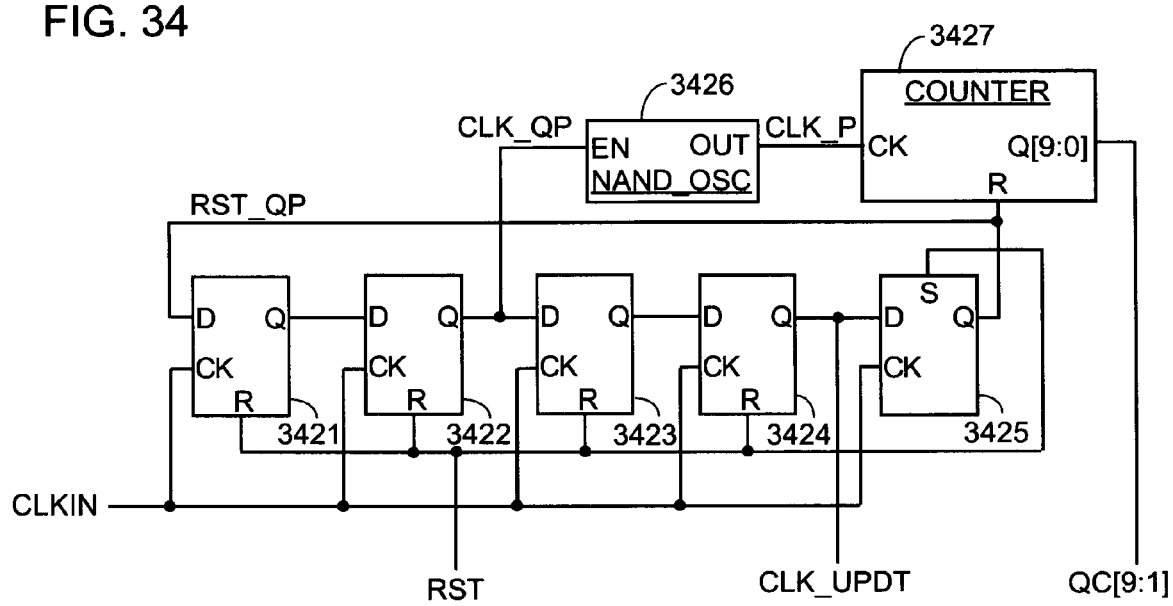
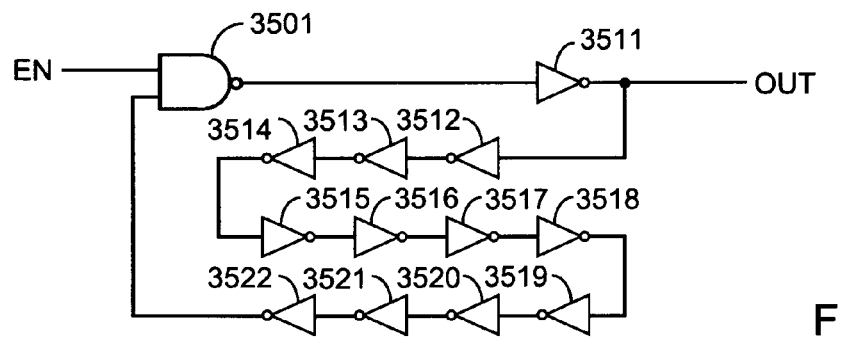
FIG. 35

FIG. 36
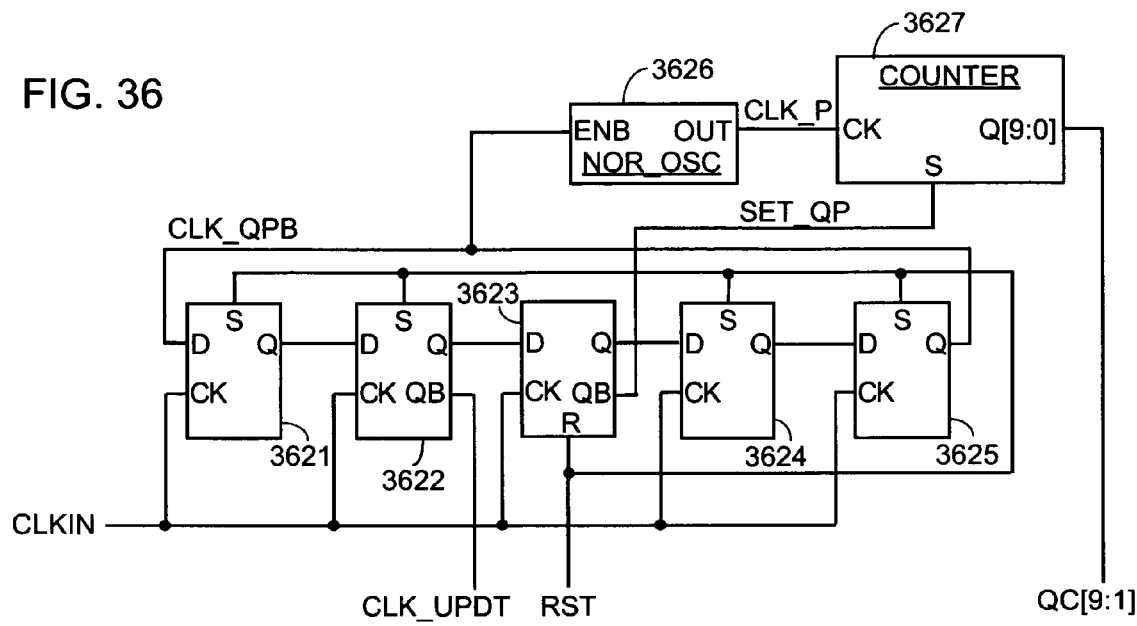
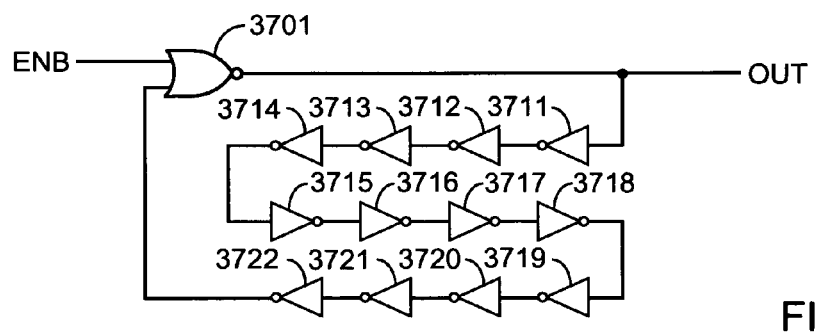
FIG. 37

COUNTER-BASED CLOCK MULTIPLIER CIRCUITS AND METHODS

CROSS-REFERENCE TO RELATED APPLICATIONS

This application is a continuation-in-part of commonly assigned application Ser. No. 11/058,043, by Andy T. Nguyen, entitled "Counter-Based Digital Frequency Synthesizer Circuits and Methods" and filed Feb. 15, 2005 now U.S. Pat. No. 7,139,361, which is a continuation-in-part of Ser. No. 10/651,811 now U.S. Pat. No. 6,906,562, by Andy T. Nguyen, entitled "Counter-Based Clock Multiplier Circuits and Methods", filed Aug. 29, 2003 and issued Jun. 14, 2005, which is a continuation-in-part of application Ser. No. 10/618,329, by Andy T. Nguyen, entitled "Counter-Based Clock Doubler Circuits and Methods with Optional Duty Cycle Correction and Offset" and filed Jul. 11, 2003 now U.S. Pat. No. 7,005,900, all of which applications and patents are hereby incorporated herein by reference.

FIELD OF THE INVENTION

The invention relates to clock multiplier circuits. More particularly, the invention relates to counter-based clock multiplier circuits and methods.

BACKGROUND OF THE INVENTION

Clock signals are used in virtually every IC and electronic system to control timing. For example, every time a rising edge occurs on a clock signal, all the flip-flops in a circuit might change state. Clearly, the higher the frequency of the clock signal, the faster the circuit operates. Therefore, where performance is an issue, circuit designers usually prefer to use the fastest available clock that can be supported by the delays on the logic paths through the circuit. In other words, the performance of a circuit is typically limited by the logic delays on the slowest logic path. However, sometimes the longest path delay through the circuit is significantly shorter than the period of the available clock, and the frequency of the available clock becomes the limiting factor.

To overcome this limitation, circuit designers can increase (e.g., double or quadruple) the frequency of a clock signal using a phase-lock loop (PLL) or delay-lock loop (DLL) circuit. However, PLLs are analog in nature and take a long time to simulate, and a design that works in one manufacturing process may stop working when manufactured using another process. Therefore, PLLs are very difficult to design, and often are not feasible in a given circuit or system. DLLs can also be very complicated and difficult to design. Additionally, DLLs typically consume a great deal of silicon area. Therefore, clock frequency multiplication is often not feasible using known circuits and methods.

Therefore, it is desirable to provide circuits and methods that enable a circuit designer to increase the frequency of an input clock without using a PLL or DLL, using a fairly simple circuit that consumes a relatively small amount of silicon area. Preferably, such circuits and methods can optionally be implemented using the logic resources included in a programmable logic device (PLD).

SUMMARY OF THE INVENTION

The invention provides clock multiplier circuits and methods that use counters to define the desired positions of the output clock edges. A clock multiplier circuit accepts an input clock signal and provides an output clock signal having a frequency higher that of the input clock signal. A clock multiplier circuit according to one embodiment of the invention includes a plurality of counter circuits, each clocked by a count clock relatively much faster than the input clock signal. In some embodiments, each counter includes a small oscillator circuit implemented in the same fashion and generating a count clock for the counter. Thus, each counter uses a count clock having the same clock frequency.

A first counter is periodically enabled to count for one input clock period, and the counted value is stored in a register. Thus, the stored value represents the number of counts in one input clock period. In some embodiments, the counted value is divided by two prior to storing the value in the register. The counted value is then divided by various values (e.g., two, four, eight, sixteen), the resulting divided numbers representing the number of counts in various fractions of the input clock period. The divided numbers are then combined in various ways (e.g., by adding together appropriate ones of the divided numbers) to provide counter stop values.

Starting at a first edge of the input clock, a second counter counts from an initial value (e.g., upward from all ones), and the result is compared in turn to each of the counter stop values. When the value in the second counter matches one of the counter stop values, a pulse is generated on the output clock signal. Thus, the second counter generates a pulse at a series of predetermined times in the input clock period, the times being determined by the counter stop values.

Some embodiments include a duty cycle correction feature, wherein the duty cycle of the output clock signal is independent of the duty cycle of the input clock signal. For example, the output clock signal can have a 50 percent duty cycle.

BRIEF DESCRIPTION OF THE DRAWINGS

The present invention is illustrated by way of example, and not by way of limitation, in the following figures.

FIG. 34 is a schematic diagram of a first counter circuit that can be used, for example, in the clock multiplier circuit of FIG. 32.

FIG. 35 is a schematic diagram of a NAND-based oscillator circuit that can be used, for example, in the circuit of FIG. 34.

FIG. 36 is a schematic diagram of a second counter circuit that can be used, for example, in the clock multiplier circuit of FIG. 32.

FIG. 37 is a schematic diagram of a NOR-based oscillator circuit that can be used, for example, in the circuit of FIG. 36.

DETAILED DESCRIPTION OF THE DRAWINGS

In the following description, numerous specific details are set forth to provide a more thorough understanding of the present invention. However, it will be apparent to one skilled in the art that the present invention can be practiced without these specific details.

Figure 1:
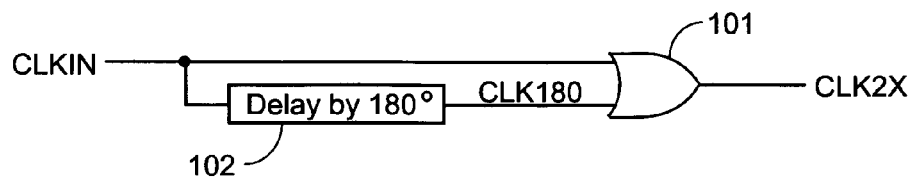
FIG. 1 illustrates a first prior art clock doubler circuit without duty cycle correction (DCC).

FIG. 1 illustrates a well known art clock doubler circuit without duty cycle correction (DCC). The clock doubler circuit of FIG. 1 has the advantages of being small and easy to implement, but also has several disadvantages. For example, the circuit of FIG. 1 functions correctly only when the input clock signal CLKIN has a duty cycle of less than 50 percent (e.g., the high value persists for less than half the length of the input clock cycle). Further, the circuit only provides a symmetrical output clock signal CLK2X for one input clock frequency.

The clock doubler circuit of FIG. 1 includes a logical OR gate 101 and a delay element 102 having a delay of half the input clock period. Logical OR gate 101 is driven by input clock signal CLKIN and by input clock signal CLKIN delayed by delay element 102, and provides output clock signal CLK2X. (In the present specification, the same reference characters are used to refer to terminals, signal lines, and their corresponding signals.)

When input clock signal CLKIN goes high, logical OR gate 101 drives output clock signal CLK2X high. Less than one-half clock period later, signal CLKIN goes low. Signal CLK180 (provided by delay element 102) is also still low. Therefore, logical OR gate 101 drives output clock signal CLK2X low. At the half-way point of the input clock period, signal CLK180 goes high, and logical OR gate 101 drives output clock signal CLK2X high again. Less than one-half clock period later, signal CLK180 goes low. Signal CLKIN is still low, so logical OR gate 101 drives output clock signal CLK2X low. Thus, signal CLK2X has twice the frequency of signal CLKIN. The length of the high pulse is unchanged from signal CLKIN, so the duty cycle of the output signal CLK2X is twice the duty cycle of the input signal CLKIN.

As previously noted, the circuit of FIG. 1 only provides a symmetrical output clock signal CLK2X for one input clock frequency. However, this frequency can be varied by changing the delay of delay element 102 to correspond to one-half of the input clock period, e.g., using programmable logic.

Figure 2:
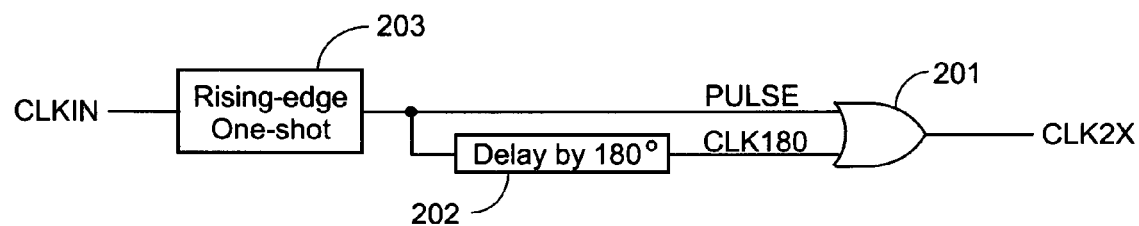
FIG. 2 illustrates a second prior art clock doubler circuit without DCC.

FIG. 2 illustrates another well known clock doubler circuit. The circuit of FIG. 2 provides an output duty cycle independent of that of the input clock signal, because the duty cycle of the output signal is controlled by an included one-shot. The circuit of FIG. 2 includes a logical OR gate 201, a delay element 202 having a delay of half the input clock period, and a rising-edge one-shot 203. One-shot 203 provides a pulse on signal PULSE whenever a rising edge occurs on input clock signal CLKIN. Logical OR gate 201 is driven by signal PULSE and by input clock signal CLKIN delayed by delay element 102, and provides output clock signal CLK2X.

When input clock signal CLKIN goes high, one-shot 203 provides a high value on signal PULSE. In response, logical OR gate 201 drives output clock signal CLK2X high. At the end of the high pulse from one-shot 203, signal PULSE goes low. Signal CLK180 (provided by delay element 102 from signal PULSE) is also still low. Therefore, logical OR gate 201 drives output clock signal CLK2X low. At the half-way point of the input clock period, signal CLK180 goes high, and logical OR gate 201 drives output clock signal CLK2X high again. At the end of the high pulse from delay element 202, signal CLK180 goes low. Signal CLKIN is still low, so logical OR gate 201 drives output clock signal CLK2X low. Thus, signal CLK2X has twice the frequency of signal CLKIN, and the duty cycle of signal CLK2X is determined by the length of the pulse generated by one-shot 203.

A pulse generated by a one-shot has a length that depends on process, power high level, and temperature. Therefore, the location of the falling edge of output signal CLK2X can vary with these factors. Further, the output pulse from one-shot 203 must be of sufficient duration to ensure a complete pulse regardless of these external factors, which can become a limiting factor to the frequency of input clock signal CLKIN.

As with the clock doubler circuit of FIG. 1, the clock doubler circuit of FIG. 2 is accurate for only one clock frequency. This frequency can be varied, however, if delay element 202 is programmable.

Figure 3:
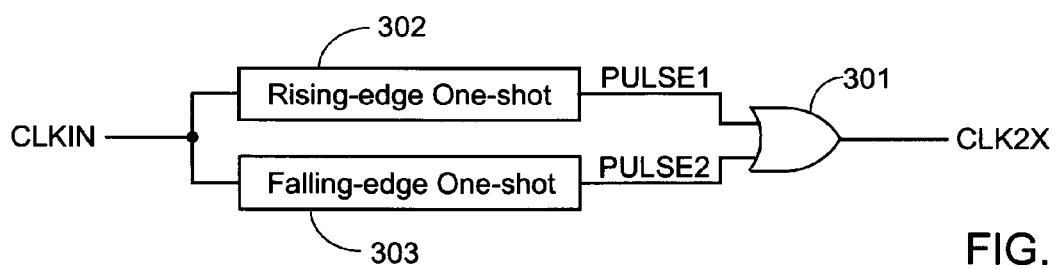
FIG. 3 illustrates a third prior art clock doubler circuit without DCC.

FIG. 3 shows a third well known clock doubler circuit that also does not provide DCC. In the circuit of FIG. 3, a rising-edge one-shot 302 provides a pulse on signal PULSE1 in response to each rising edge of input signal CLKIN, while a falling-edge one-shot 303 provides a pulse on signal PULSE2 in response to a falling edge on signal CLKIN. Thus, logical OR gate 301 provides a complete pulse on output clock signal CLK2X in response to each edge (both rising and falling) of signal CLKIN.

Because the circuit of FIG. 3 does not include a delay element tailored to the input clock frequency, the circuit can be used for various input clock frequencies. However, as in the circuit of FIG. 2, the one-shots can become limiting factors to the frequency of input clock signal CLKIN. Additionally, the circuit of FIG. 3 does not provide duty cycle correction, which is often a desirable feature in a clock doubler circuit. Further, the circuit of FIG. 3 only provides a symmetrical frequency on the output clock if the input clock signal has a 50 percent duty cycle.

Figure 4:
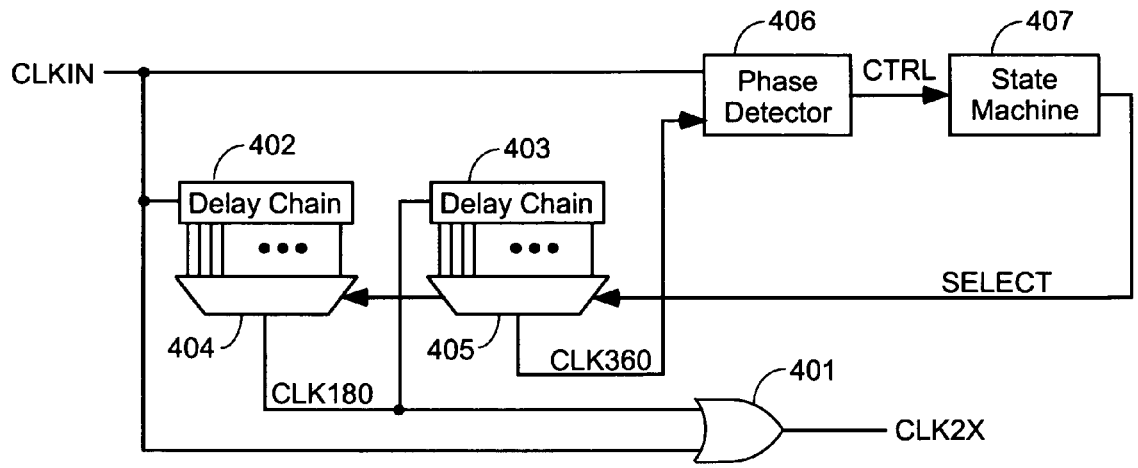
FIG. 4 illustrates a prior art clock doubler circuit that uses a DLL and does not provide DCC.

FIG. 4 illustrates a known clock doubler circuit that uses a DLL to generate output clock signal CLK2X. The clock doubler of FIG. 4 does not provide DCC, and requires an input clock signal having a duty cycle of less than 50 percent. The circuit of FIG. 4 actually corresponds to the circuit of FIG. 1, with delay element 102 being implemented using a DLL (including elements 402–407), and logical OR gate 401 corresponding to logical OR gate 101. However, the circuit of FIG. 4 has the advantage of supporting a range of input clock frequencies, rather than being tailored to support a single clock frequency.

The clock doubler of FIG. 4 includes logical OR gate 401, delay chains 402–403, clock multiplexers 404–405, phase detector 406, and state machine 407. Delay chains 402–403 and multiplexers 404–405 provide signals CLK180 and CLK360, respectively, delayed from signal CLKIN by one-half and one full clock cycle, respectively. (Note that as in the circuit of FIG. 1, the signal name CLK180 denotes a signal delayed by one-half clock period, i.e., 180 degrees, from input clock signal CLKIN.) Logical OR gate 401 is driven by input clock signal CLKIN and signal CLK180 from the DLL.

Signal CLK360 is provided to phase detector 406 along with input signal CLKIN, and phase detector 406 provides control signals CTRL (e.g., signals ADD and SUBTRACT, not shown) indicating a phase relationship between signals CLKIN and CLK360. State machine 407 receives control signals CTRL and provides SELECT signals that control clock multiplexers 404 and 405 to select appropriate clock signals CLK180 and CLK360. Thus, the DLL comprising elements 402–407 ensures the correct phase relationship between each signal CLK180, CLK360 and input clock signal CLKIN, and the clock doubler circuit is accurate over a range of input clock frequencies. The output clock signal CLK2X has twice the duty cycle of input clock signal CLKIN.

A significant disadvantage of the circuit of FIG. 4 is that implementing DLLs typically requires a large amount of circuitry.

The circuit of FIG. 4 can also be modified by adding a one-shot to the input clock path (see one-shot 203 of FIG. 2). The resulting clock doubler circuit supports input clock signals having duty cycles greater than 50 percent.

Figure 5:
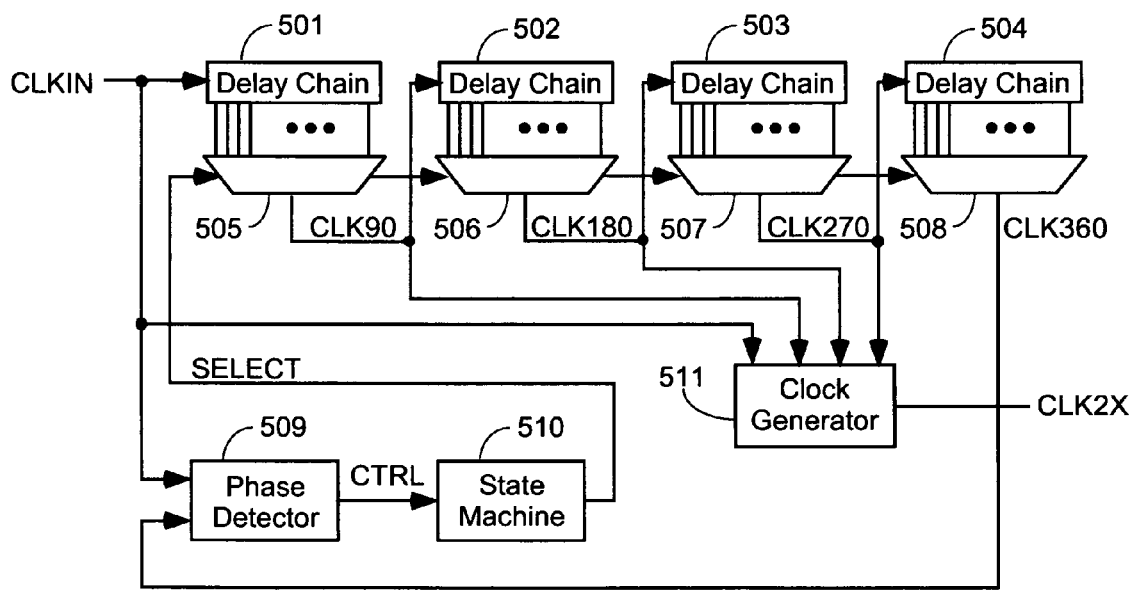
FIG. 5 illustrates a prior art clock doubler circuit that uses a DLL and provides DCC.

FIG. 5 illustrates another known clock doubler circuit that includes a DLL. The clock doubler of FIG. 5 supports a range of input clock frequencies, as in the clock doubler circuit of FIG. 4, but provides an output clock signal CLK2X having a 50 percent duty cycle.

The clock doubler of FIG. 5 includes clock generator 511, delay chains 501–504, clock multiplexers 505–508, phase detector 509, and state machine 510. Delay chains 501–504 and multiplexers 505–508 provide signals CLK90, CLK180, CLK270, and CLK360, respectively, delayed from signal CLKIN by one-quarter, one-half, three-quarters, and one full clock cycle, respectively. Clock generator 511 is driven by signals CLKIN, CLK90, CLK180, and CLK270, and provides output clock signal CLK2X.

Signal CLK360 is provided to phase detector 509 along with input signal CLKIN, and phase detector 509 provides control signals CTRL (e.g., signals ADD and SUBTRACT, not shown) indicating a phase relationship between signals CLKIN and CLK360. State machine 510 receives control signals CTRL and provides SELECT signals that control clock multiplexers 505–508 to select appropriate clock signals CLK90, CLK180, CLK270, and CLK360. Thus, the DLL comprising elements 501–511 ensures the correct phase relationship between each signal CLK90, CLK180, CLK270, CLK360 and input clock signal CLKIN, and the clock doubler circuit is accurate over a range of input clock frequencies. Clock generator 511 uses the signals CLKIN, CLK90, CLK180, and CLK270, which accurately reflect the starting point, one-quarter, one-half, and three-quarter points of the input clock cycle, to generate successive edges of output clock signal CLK2X. Thus, signal CLK2X has a 50 percent duty cycle.

As in the circuit of FIG. 4, implementing the circuit of FIG. 5 requires a large amount of circuitry. The circuit can be reduced in size by using a PLL. However, PLLs are very process-dependent, as described in the background section above, and digital solutions are often preferred.

Figure 6:
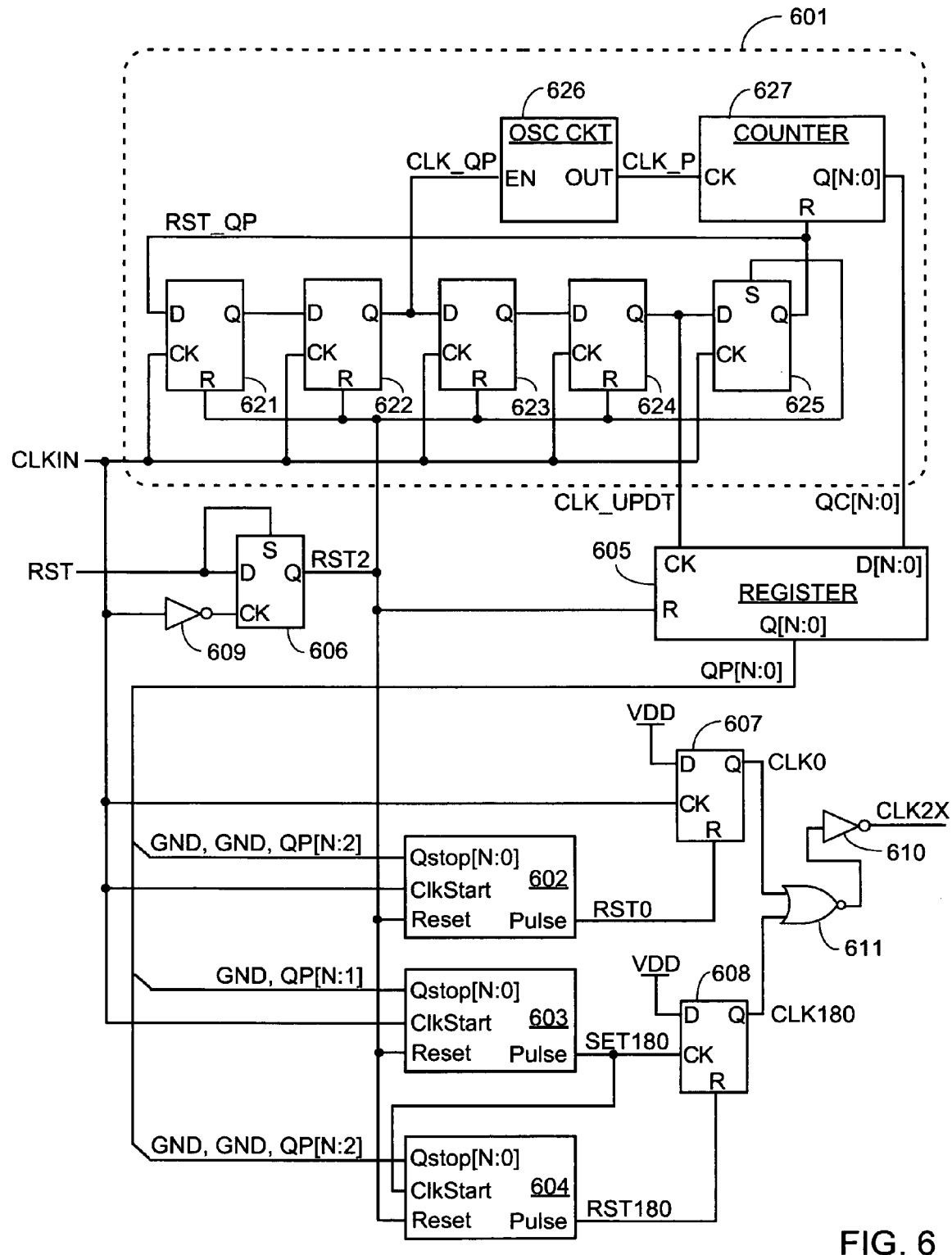
FIG. 6 is a schematic diagram of a clock doubler circuit according to an embodiment of the invention that provides 50 percent DCC.

FIG. 6 illustrates a circuit providing the same advantages (50 percent duty cycle, wide range of input frequencies), but requiring less circuitry than the circuit of FIG. 5. The circuit of FIG. 6 is small enough, for example, to be a practical addition to user circuits implemented in programmable logic devices (PLDs) such as field programmable gate arrays (FPGAs).

Figure 7:
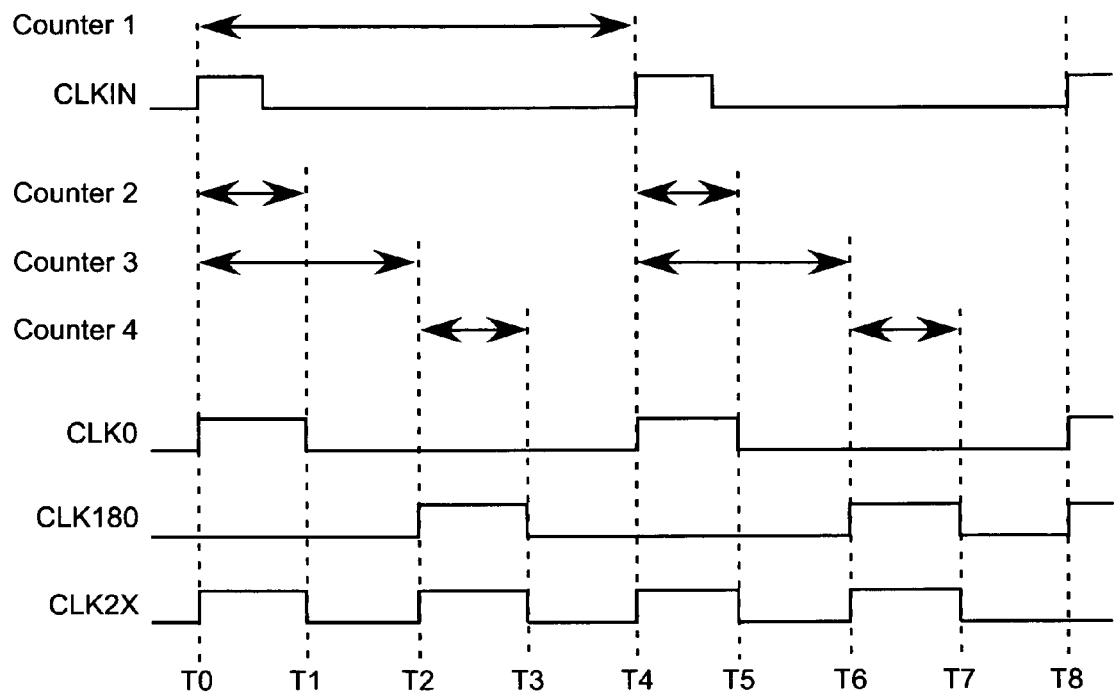
FIG. 7 is a timing diagram for the clock doubler of FIG. 6.

FIG. 6 is a schematic diagram of a clock doubler circuit according to one embodiment of the invention that includes four counters 601–604, a register 605, a reset circuit (flip-flop 606 and inverter 609), and an output clock generator (elements 607–608 and 610–611). The circuit of FIG. 6 operates as shown in FIG. 7. Thus, the combination of FIGS. 6 and 7 should be consulted in conjunction with the following explanation of the circuit of FIG. 6.

Counter 1 (601) uses a relatively faster clock signal (e.g., generated by an oscillator circuit 626) to count a number of counts P in one period of input clock signal CLKIN. The number of counts P is stored in register 605. When signal CLKIN goes high at time T0, the power high VDD value is clocked into flip-flop 607, driving signal CLK0 high and resulting in a high value on signal CLK2X. The number of counts P is recounted, in the pictured embodiment, during every fifth input clock cycle.

Counters 2, 3, and 4 (602, 603, and 604, respectively) are clocked by similar faster clock signals (e.g., generated by oscillator circuits having the same design and configuration as oscillator circuit 626). Counter 2 (602) starts counting when input clock signal CLKIN (ClkStart) goes high, and compares the count value with one-fourth of the value stored in register 605 (i.e., P/4). Note that counter 2 does not use the two least significant bits from register 605, thus dividing the value in register 605 by four to provide the counter stop value Qstop[N:0]. When the value in counter 2 reaches P/4 (at time T1 of FIG. 7), counter 2 (602) provides a high output pulse on signal RST0. The high output pulse resets flip-flop 607, driving signal CLK0 low at time T1, as shown in FIG. 7. The high output pulse also resets counter 2. Because signal CLK180 is also low, NOR gate 611 provides a high value to inverter 610, which drives output clock signal CLK2X low at time T1.

Counter 3 (603) starts counting when input clock signal CLKIN (ClkStart) goes high, and compares the count value with one-half of the value stored in register 605 (i.e., P/2). Note that counter 3 does not use the least significant bit from register 605, thus dividing the value in register 605 by two to provide the counter stop value Qstop[N:0]. When the value in counter 3 reaches P/2 (at time T2 of FIG. 7), counter 3 (603) provides a high output pulse on signal SET180. The high output pulse clocks the power high VDD value into flip-flop 608, driving signal CLK180 high at time T2, as shown in FIG. 7. The high output pulse also resets counter 3. In response, NOR gate 611 provides a low value to inverter 610, which drives output clock signal CLK2X high at time T2.

Counter 4 (604) starts counting when signal SET180 (ClkStart) goes high, and compares the count value with one-fourth of the value stored in register 605 (i.e., P/4). Note that counter 4 does not use the two least significant bits from register 605, thus dividing the value in register 605 by four to provide the counter stop value Qstop[N:0]. When the value in counter 4 reaches P/4 (at time T3 of FIG. 7), counter 4 (604) provides a high output pulse on signal RST180. The high output pulse resets flip-flop 608, driving signal CLK180 low at time T3, as shown in FIG. 7. The high output pulse also resets counter 4. Because signal CLK0 is also low, NOR gate 611 provides a high value to inverter 610, which drives output clock signal CLK2X low at time T3.

In the pictured embodiment, the reset signal for each of counters 1–4 (601–604) and register 605 is signal RST2, which is provided by flip-flop 606. Whenever a global reset signal RST is high (active), flip-flop 606 ensures that signal RST2 is also high, resetting all counters and register 605. Whenever the global reset signal RST is low (inactive), flip-flop 606 clocks in the low value and drives signal RST2 low on the next falling edge of signal CLKIN.

In the pictured embodiment, counter 1 (601) is designed to recount the length of the input clock pulse (i.e., to generate a new value of P) every fifth clock cycle. In other embodiments, the periodicity of the count has other values, e.g., the desired periodicity can be selected based on the stability of the input clock frequency. In other embodiments, other implementations of counter circuit 601 are used. Any appropriate embodiment can be used.

Counter circuit 601 has as inputs input clock signal CLKIN and reset signal RST2. Counter circuit 601 provides a clock update signal CLK_UPDT and a counter output bus QC[N:0]. In the pictured embodiment, counter circuit 601 includes a counter 627, which counts a number of counts in one period of the input clock signal CLKIN.

In the pictured embodiment, counter circuit 601 includes reset flip-flops 621–624, set flip-flop 625, oscillator circuit 626, and counter 627. Flip-flops 621–625 are coupled in series, and serve to provide three non-overlapping clock pulses in the following repeating sequence: RST_OP, CLK_QP, and CLK_UPDT. Each of these signals is high for only one clock cycle.

Initially, signal RST_QP is high, because flip-flop 625 is a set flip-flop, and counter 627 is reset. The first rising edge of signal CLKIN brings signal RST_QP low. On the second rising edge of signal CLKIN, signal CLK_OP provides a high value on oscillator enable signal EN to oscillator circuit 626. Thus, oscillator enable signal EN is high for one out of every five input clock cycles. Oscillator circuit 626 generates a relatively fast oscillator output signal OUT (i.e., faster than input clock signal CLKIN) whenever signal EN is high. The oscillator output signal CLK_P is used by counter 627 to measure the input clock period. Thus, in the pictured embodiment counter 627 performs the counting process only during one input clock period out of each five input clock periods. On the fourth rising edge of signal CLKIN, signal CLK_UPDT goes high. On the fifth rising edge of signal CLKIN, signal RST_QP goes high again, resetting counter 627. The cycle then repeats each five clock cycles.

Note that the number of flip-flops coupled in series in counter circuit 601 determines the frequency with which the length of the input clock period is determined. For example, in the embodiment of FIG. 6, the period is measured every five clock cycles. By adding another reset flip-flop to the chain (e.g., in front of set flip-flop 625), the period would be measured every six clock cycles, and so forth. It will be clear to one of skill in the relevant arts that this selection is a matter of design choice.

Figure 8:
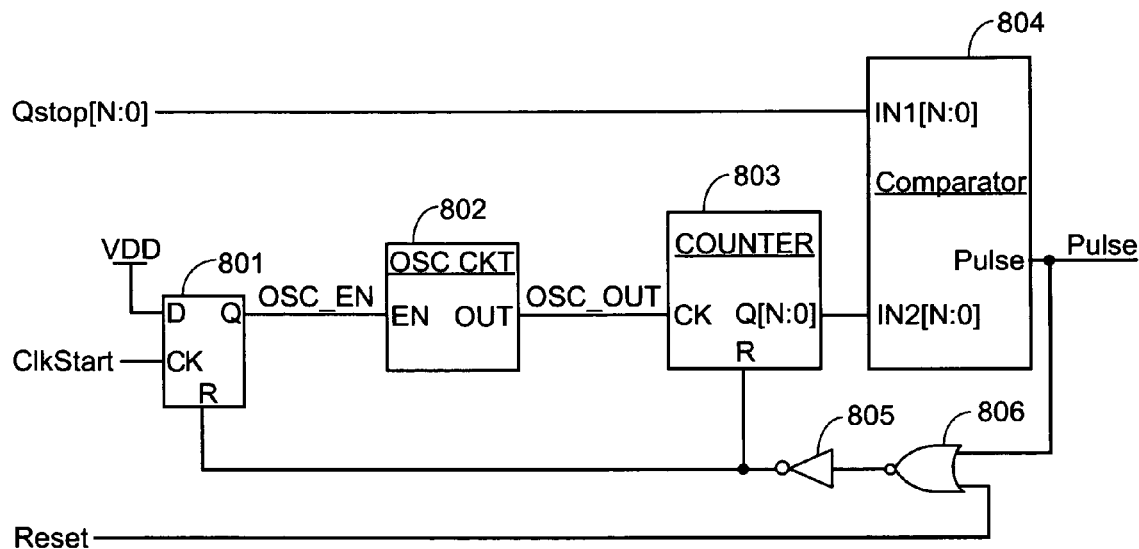
FIG. 8 is a schematic diagram of a counter circuit that can optionally be used to implement three of the counters in the embodiment of FIG. 6.

FIG. 8 is a schematic diagram of one counter embodiment that can be used to implement counters 602–604 of FIG. 6. This embodiment can be used, for example, when counter 601 is implemented as shown in FIG. 6. The counter of FIG. 8 includes a reset flip-flop 801, an oscillator circuit 802, a counter 803, a comparator 804, a NOR gate 806, and an inverter 805. When signal ClkStart goes high, the power high VDD value is clocked into flip-flop 801, driving flip-flop output signal OSC_EN high and enabling oscillator 802. Oscillator 802 provides an output signal OSC_OUT having a frequency relatively much higher than that of input clock signal CLKIN. Counter 803 is clocked by oscillator 802, and thus counts the oscillations on signal OSC_OUT. The value stored in counter 803 is passed to comparator 804, where it is compared to the value Qstop[N:0]. When the values match, signal PULSE goes high, resetting flip-flop 801 and counter 803 via NOR gate 806 and inverter 805. Signal Reset can also reset flip-flop 801 and counter 803 via NOR gate 806 and inverter 805.

Any known oscillator circuit can be used to implement oscillator circuit 802 of FIG. 8 and oscillator circuit 626 of FIG. 6. Preferably, the same implementation is used for all four oscillator circuits in the clock doubler, as this approach creates a high correlation between the four oscillators irregardless of external factors such as processing and temperature variations. For example, the well known ring oscillator design (e.g., a loop including an odd number of logic gates, e.g., two inverters and a NAND gate driven by the enable signal) can be used. This embodiment is particularly useful when the clock doubler circuit is implemented in a PLD, because the oscillator can be implemented using the programmable logic blocks of the PLD. In some embodiments, external oscillators are used.

Any known counter or counters can be used to implement counter 803 of FIG. 8 and/or counter 627 of FIG. 6. For example, the well known ripple counters can be used. In some embodiments, double-edge flip-flops are used to double the count stored in the counter. In some embodiments, a first subset of the counters use double-edge flip-flops with a first oscillator frequency, while a second subset of the counters use single-edge flip-flops with a second oscillator frequency twice that of the first oscillator frequency.

Any known comparator can be used to implement comparator 804 of FIG. 8. For example, the well known exclusive-NOR (XNOR) implementation can be used, wherein each pair of bits is provided to an XNOR gate, the XNOR gates are combined using NAND gates, and the NAND gates each drive a NOR gate providing the Pulse output signal in FIG. 8.

Figure 9:
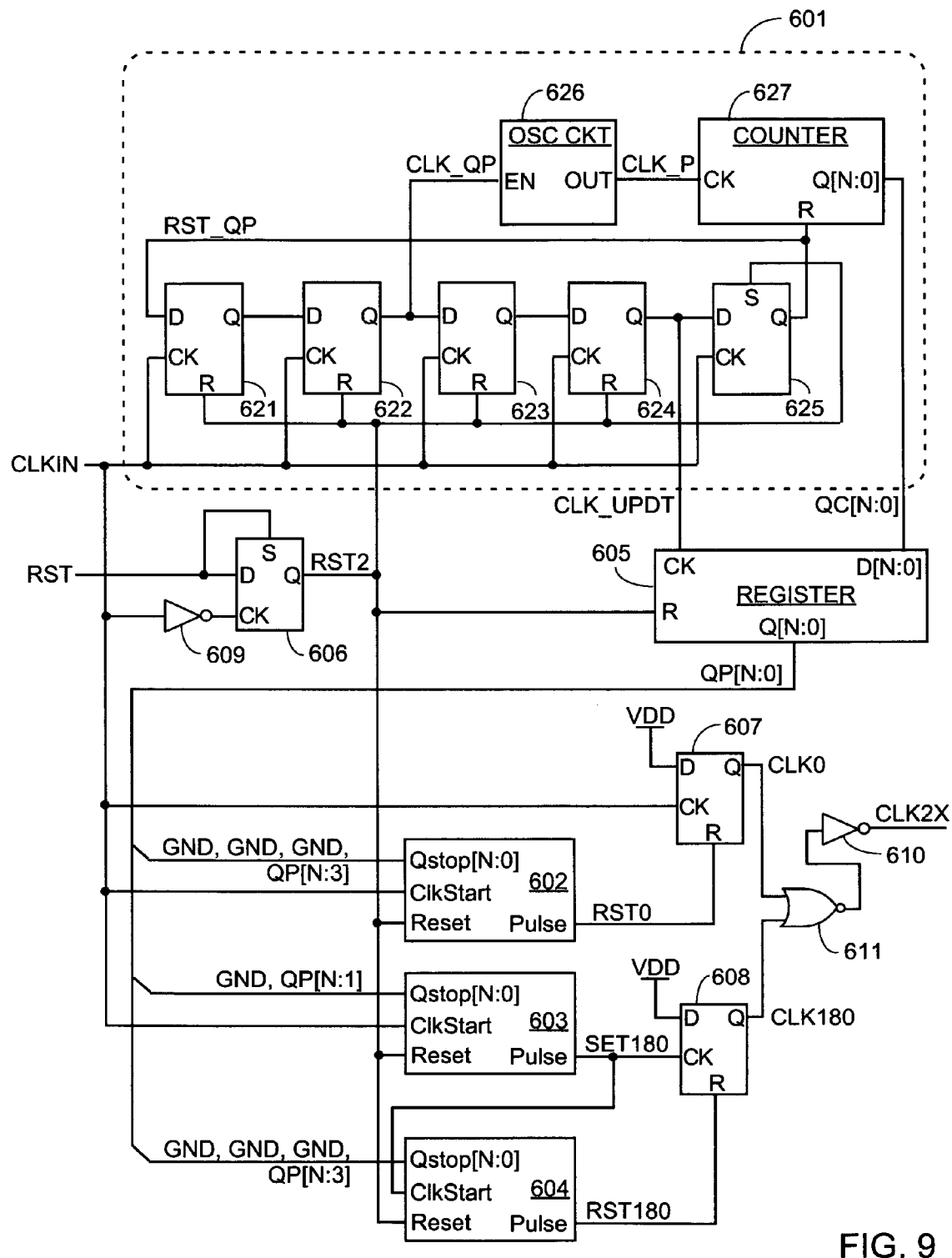
FIG. 9 is a schematic diagram of a clock doubler circuit according to an embodiment of the invention that provides 25 percent DCC.
Figure 10:
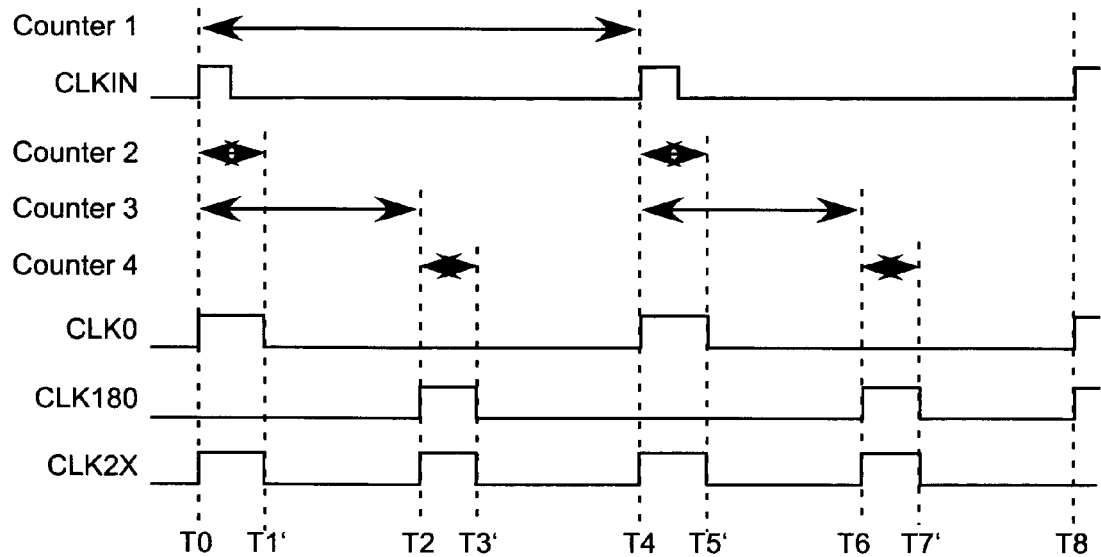
FIG. 10 is a timing diagram for the clock doubler circuit of FIG. 9.

FIG. 9 is a schematic diagram of a clock doubler circuit according to another embodiment of the invention that provides 25 percent DCC. The embodiment of FIG. 9 is similar to that of FIG. 6, but counters 2–4 (counters 602–604) are provided with different stop values, altering the positions of the output clock edges. Note that the elements of FIG. 9 are similar to those of FIG. 6, and are similarly interconnected, except as is now described. FIG. 10 is a timing diagram for the clock doubler circuit of FIG. 9.

Counter 1 (601) uses a relatively faster clock signal (e.g., generated by oscillator circuit 626) to count a number of counts P in one period of input clock signal CLKIN. The number of counts P is stored in register 605. When signal CLKIN goes high at time T0, the power high VDD value is clocked into flip-flop 607, driving signal CLK0 high and resulting in a high value on signal CLK2X. The number of counts P is recounted, in the pictured embodiment, during every fifth clock cycle.

Counters 2, 3, and 4 (602–604) are clocked by similar faster clock signals (e.g., generated by oscillator circuits having the same design and configuration as oscillator circuit 626). Counter 2 (602) starts counting when input clock signal CLKIN (ClkStart) goes high, and compares the count value with one-eighth of the value stored in register 605 (i.e., P/8). Note that counter 2 does not use the three least significant bits from register 605, thus dividing the value in register 605 by eight to provide the counter stop value Qstop[N:0]. When the value in counter 2 reaches P/8 (at time T1' of FIG. 10), counter 2 (602) provides a high output pulse on signal RST0. The high output pulse resets flip-flop 607, driving signal CLK0 low at time T1', as shown in FIG. 10. The high output pulse also resets counter 2. Because signal CLK180 is also low, NOR gate 611 provides a high value to inverter 610, which drives output clock signal CLK2X low at time T1'.

Counter 3 (603) functions in the same fashion as in the embodiment of FIG. 6, driving output clock signal CLK2X high at time T2.

Counter 4 (604) starts counting when signal SET180 (ClkStart) goes high, and compares the count value with one-eighth of the value stored in register 605 (i.e., P/8). Note that counter 4 does not use the three least significant bits from register 605, thus dividing the value in register 605 by eight to provide the counter stop value Qstop[N:0]. When the value in the counter reaches P/8 (at time T3' of FIG. 10), counter 4 (604) provides a high output pulse on signal RST180. The high output pulse resets flip-flop 608, driving signal CLK180 low at time T3', as shown in FIG. 7. The high output pulse also resets counter 4. Because signal CLK0 is also low, NOR gate 611 provides a high value to inverter 610, which drives output clock signal CLK2X low at time T3'.

Figure 12:
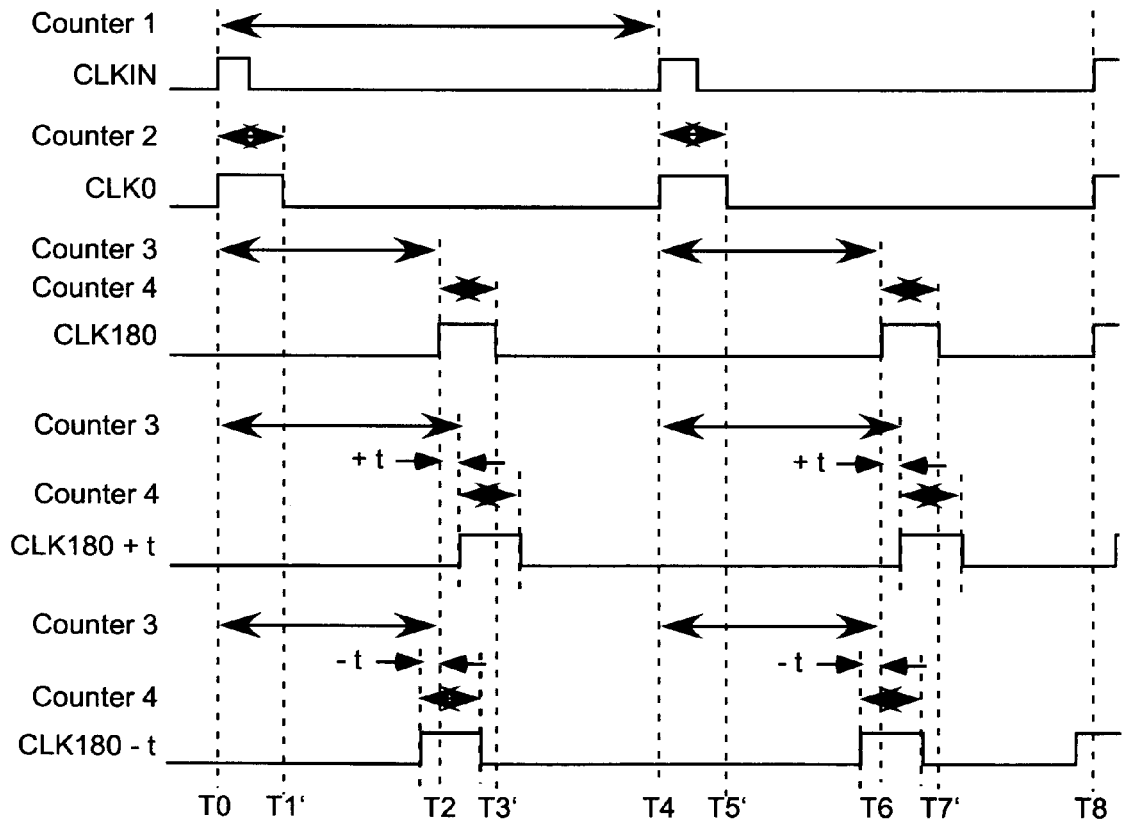
FIG. 12 is a timing diagram for the clock doubler circuit of FIG. 11.
Figure 11:
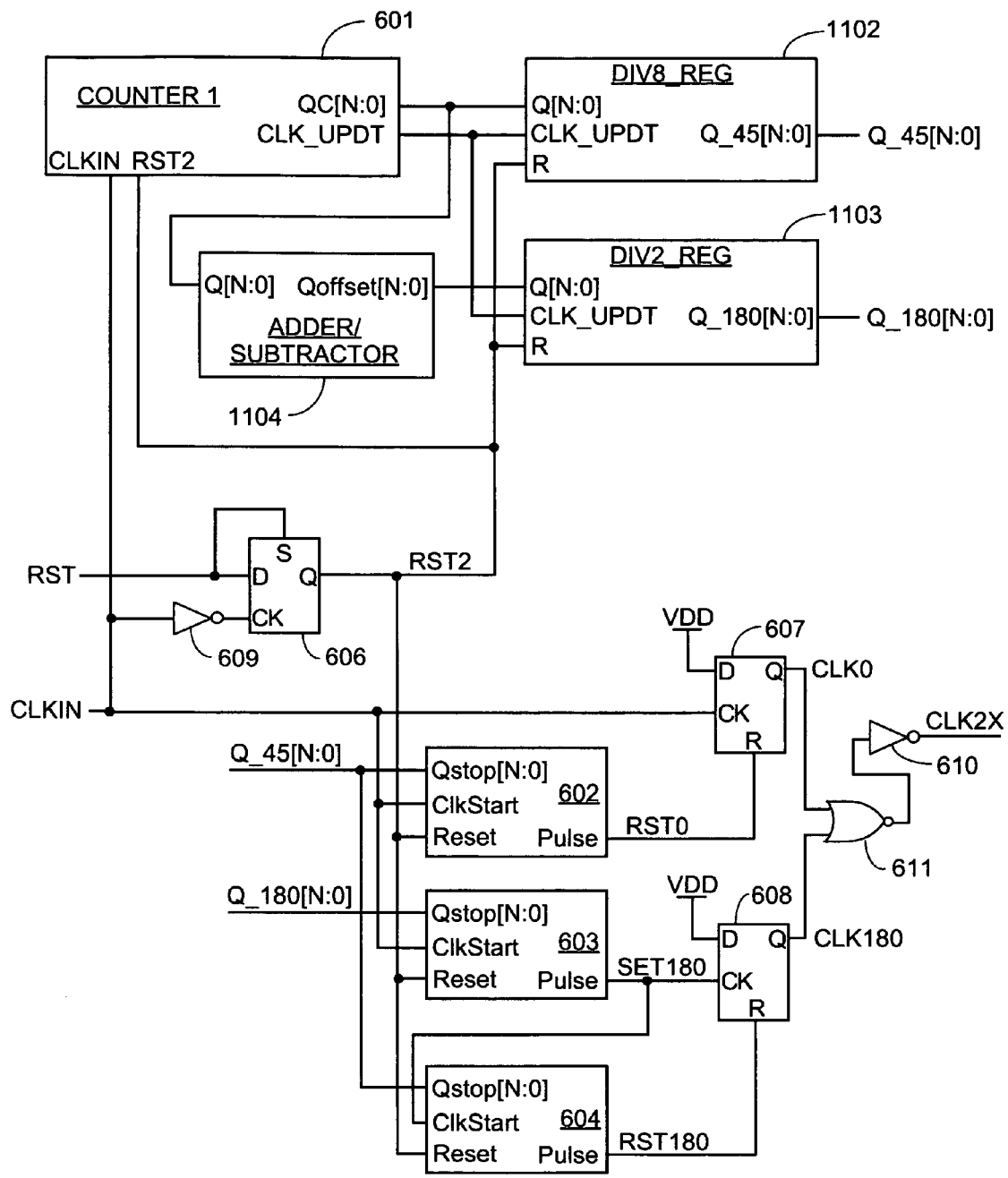
FIG. 11 is a schematic diagram of a clock doubler circuit according to an embodiment of the invention that provides 25 percent DCC and a predetermined offset.

The embodiment of FIGS. 9 and 10 demonstrates that the clock edges of the output clock signal CLK2X can be moved by altering the stop values (Qstop[N:0]) for counters 602–604. In the embodiments of FIGS. 6–10, the stop values are obtained from the registered value by shifting the bits to divide by values of two, four, or eight, for example. FIGS. 11–12 illustrate an embodiment in which the stop values are altered in another fashion—by adding or subtracting a value from the stop values for the counters, thereby providing a predetermined offset value for alternating clock cycles.

The clock doubler circuit of FIG. 11 provides 25 percent DCC and a predetermined offset. The circuit includes four counters 601–604 (which can be similar, for example, to counters 601–604 of FIGS. 6 and 9), a divide-by-eight register 1102, a divide-by-two register 1103, a reset circuit (flip-flop 606 and inverter 609, similar to the elements of FIGS. 6 and 9), and an output clock generator (elements 607–608 and 610–611, also similar to the elements of FIGS. 6 and 9). The circuit of FIG. 11 operates as shown in FIG. 12. Thus, the combination of FIGS. 11 and 12 should be consulted in conjunction with the following explanation of the circuit of FIG. 11. Functionality similar to that of previous figures is not further described.

Counter 1 (601) functions in the same fashion as in FIGS. 6 and 9. Thus, the number of counts P is provided on output terminals QC[N:0]. The number of counts P can be recounted, for example, every fifth clock cycle.

Figure 13:
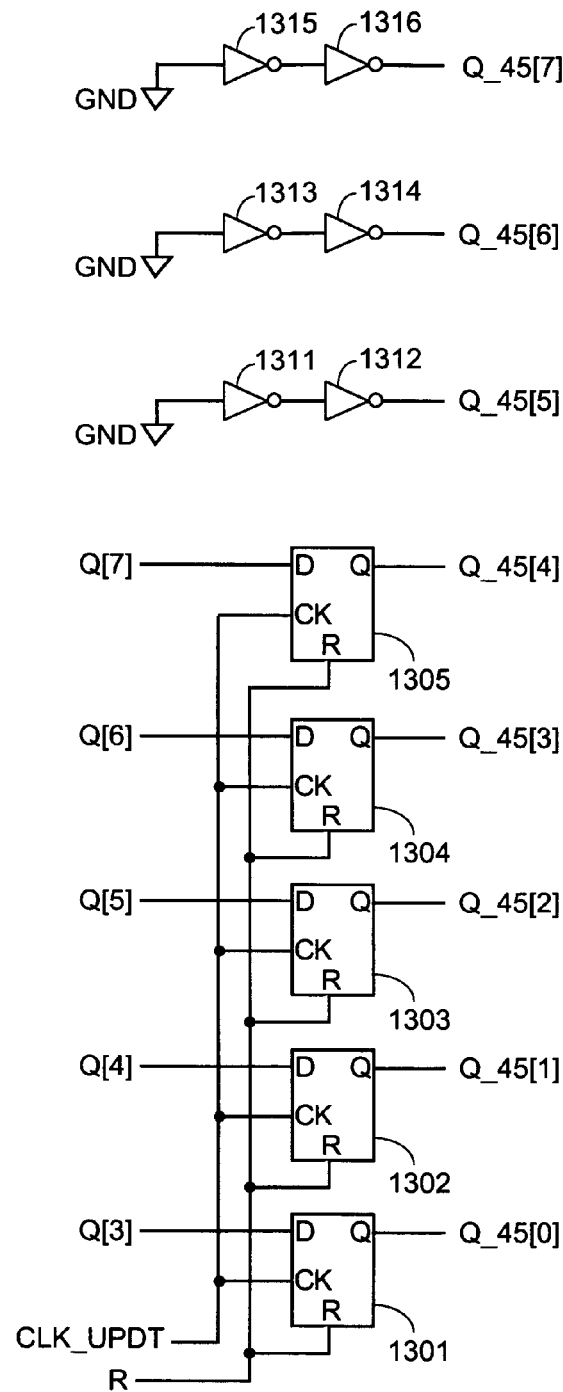
FIG. 13 is a schematic diagram of a divide-by-eight register that can optionally be used in the embodiment of FIG. 11.

The number of counts P is provided to divide-by-eight register 1102, where the value is divided by eight and registered. For example, the division can be performed by simply shifting the number of counts by three bits towards the least significant bit (LSB), as in the embodiments of FIGS. 6 and 9. In some embodiments, divide-by-eight register 1102 is implemented as shown in FIG. 13. From divide-by-eight register 1102, the divided value is provided to the Qstop terminals of counters 602 and 604 via signals Q_45[N:0].

Figure 14:
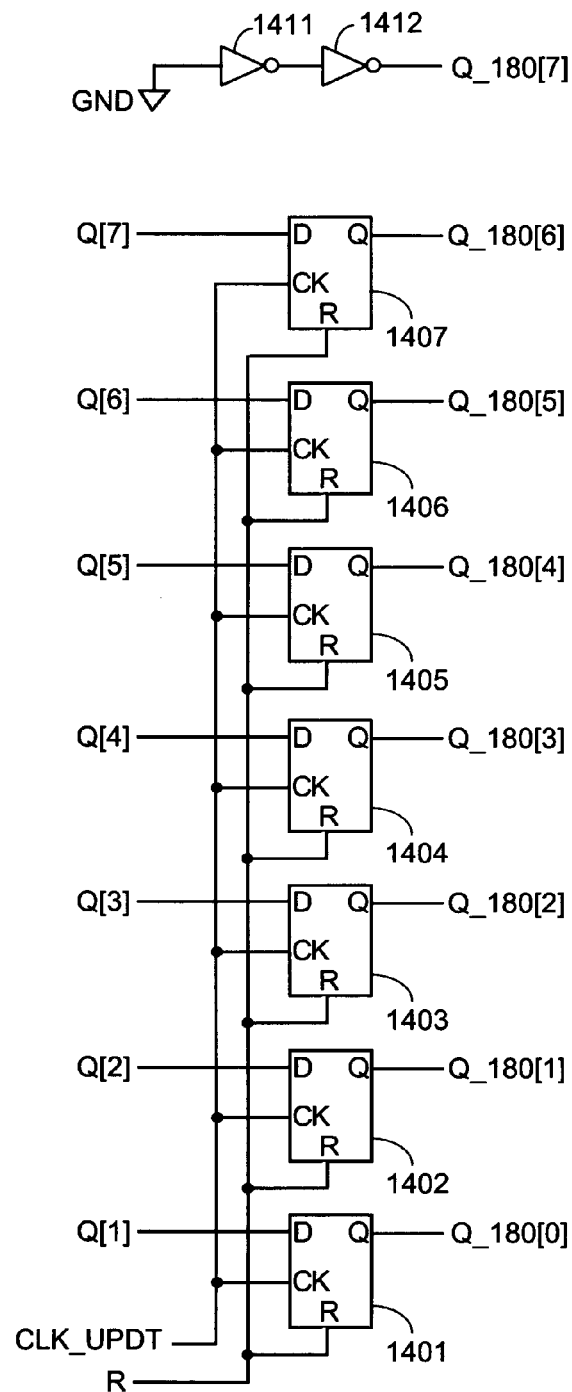
FIG. 14 is a schematic diagram of a divide-by-two register that can optionally be used in the embodiment of FIG. 11.

The number of counts P is also provided to divide-by-two register 1103, but is first altered by adding or subtracting a value from the number of counts using adder/subtractor 1104. (In some embodiments, not shown, the number of counts is first divided and then offset by a predetermined value, rather than performing the offset prior to the division as in the pictured embodiment.) The offset divided value Qoffset[N:0] is divided by two (e.g., by shifting by one bit towards the LSB) and stored. One embodiment of divide-by-two register 1103 is shown in FIG. 14. The divided and offset value is provided to counter 3 (603) as the stop value Qstop[N:0] via signals Q_180[N:0]. Adder/subtractors are well known in the relevant arts, and any suitable implementation can be used.

As in previously described embodiments, counters 2, 3, and 4 (602, 603, and 604) are clocked by similar faster clock signals (e.g., generated by oscillator circuits having the same design and configuration as oscillator circuit 626). Counter 2 (602) starts counting when input clock signal CLKIN (ClkStart) goes high, and compares the count value with the value stored in divide-by-eight register 1102 (i.e., one-eighth of the value stored in register 605, or P/8). When the value in the counter reaches P/8 (at time T1' of FIG. 12), counter 2 (602) provides a high output pulse on signal RST0. The high output pulse resets flip-flop 607, driving signal CLK0 low at time T1', as shown in FIG. 12. The high output pulse also resets counter 2. Because signal CLK180 is also low, NOR gate 611 provides a high value to inverter 610, which drives output clock signal CLK2X low at time T1'.

Counter 3 (603) starts counting when input clock signal CLKIN (ClkStart) goes high, and compares the count value with the value stored in divide-by-two register 1103. Thus, the count value is compared to one-half of the count value P (i.e., P/2) plus or minus a predetermined offset. When the value in the counter reaches this stop value, counter 3 (603) provides a high output pulse on signal SET180. The high output pulse clocks the power high VDD value into flip-flop 608, driving signal CLK180 high, as shown in FIG. 12. The high output pulse also resets counter 3. In response, NOR gate 611 provides a low value to inverter 610, which drives output clock signal CLK2X high.

FIG. 12 illustrates signal CLK180 with no offset (CLK180), signal CLK180 with a positive offset t (CLK180+t, occurring after time T2), and signal CLK180 with a negative offset t (CLK180−t, occurring prior to time T2).

Counter 4 (604) starts counting when signal SET180 (ClkStart) goes high, and compares the count value with the value stored in divide-by-eight register 1102 (i.e., one-eighth of the count value P, or P/8). When the value in the counter reaches P/8, counter 4 (604) provides a high output pulse on signal RST180. The high output pulse resets flip-flop 608, driving signal CLK180 low, as shown in FIG. 12. The high output pulse also resets counter 4. Because signal CLK0 is also low, NOR gate 611 provides a high value to inverter 610, which drives output clock signal CLK2X low. As shown in FIG. 12, because the output pulse from counter 4 is counted from an offset value (the offset rising edge), the falling edge of the output pulse is also offset.

FIG. 13 is a schematic diagram of divide-by-eight register 1102 that can optionally be used in the embodiment of FIG. 11. In the pictured embodiment, the registers and counters each include N+1 bits, where N is seven. In other embodiments, the number of bits varies. For example, in the embodiment of FIGS. 11–14, if counter 1 provides an 8-bit value, counters 2 and 4 can be only 5 bits wide, while counter 3 is 7 bits wide. However, this type of simplification will be clear to those of skill in the relevant arts. Therefore, the simpler approach of consistent bit width is used in the diagrams herein, for clarity.

The register of FIG. 13 includes five reset flip-flops 1301–1305 coupled to receive signals Q[3:7], respectively, and to provide signals Q_45[0:4], respectively. The shift by three bits towards the LSB performs the divide-by-eight function. The three upper bits Q_45[5:7] are in this embodiment provided by a ground signal GND through inverters 1311–1312, 1313–1314, and 1315–1316, respectively. In other embodiments, inverters 1311–1316 are omitted. In yet other embodiments, the output bus provided by register 1102 is narrower than the output bus from counter 601 (i.e., the upper bits of bus Q_45 are omitted), and one or both of counters 602 and 604 include fewer bits than counter 601.

FIG. 14 is a schematic diagram of divide-by-two register 1103 that can optionally be used in the embodiment of FIG. 11. The register of FIG. 14 includes seven reset flip-flops 1401–1407 coupled to receive signals Q[1:7], respectively, and to provide signals Q_180[0:6], respectively. The shift by one bit towards the LSB performs the divide-by-two function. The upper bit Q_180[7] is in this embodiment provided by a ground signal GND through inverters 1411–1412, respectively. In other embodiments, inverters 1411–1412 are omitted. In yet other embodiments, the output bus provided by register 1103 is narrower than the output bus from counter 601 (i.e., the most significant bit of bus Q_180 is omitted), and counter 603 includes one fewer bit than counter 601.

Figure 15:
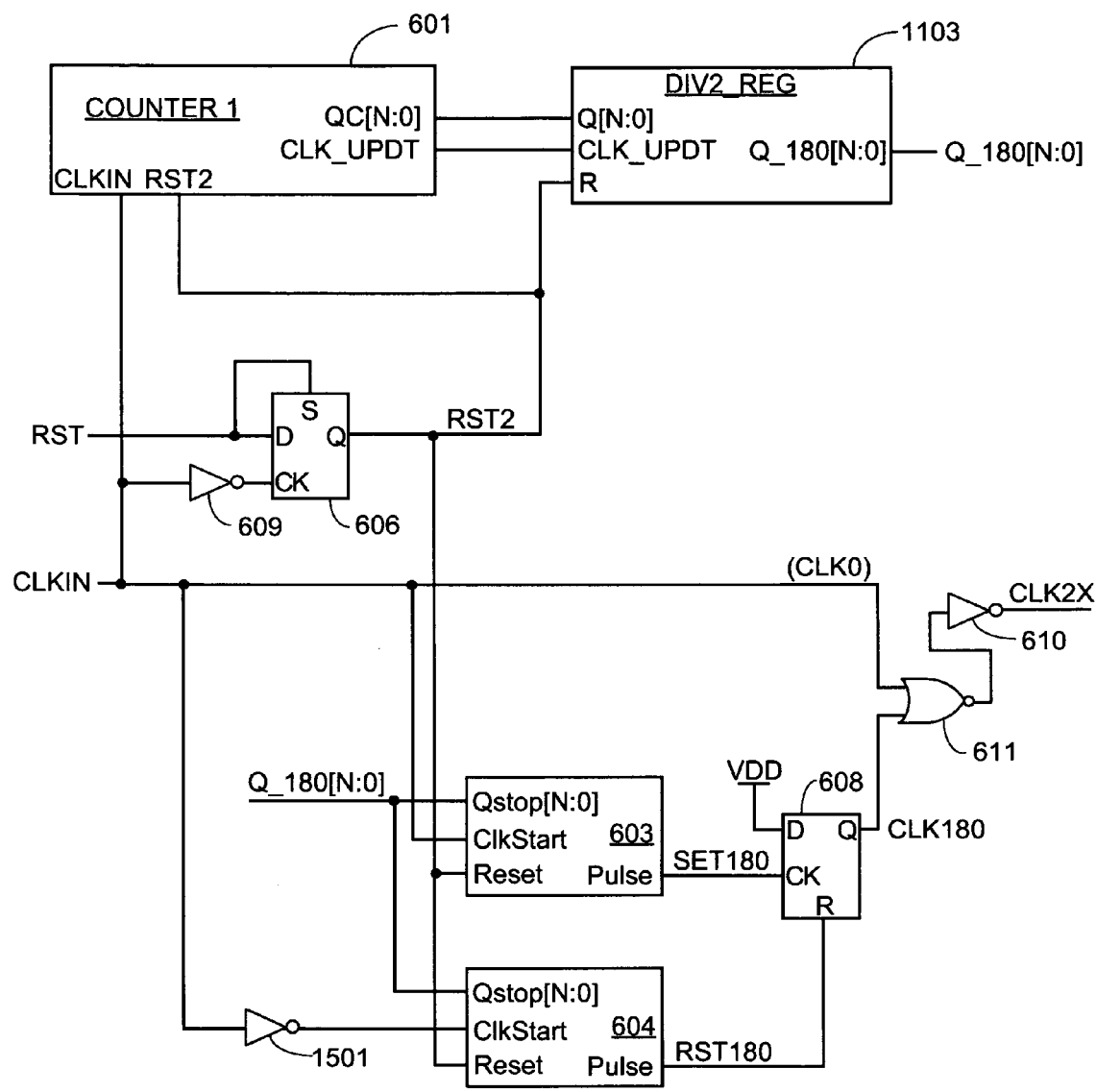
FIG. 15 is a schematic diagram of a clock doubler circuit according to an embodiment of the invention that does not provide DCC, and which passes the input clock signal to the output clock terminal when a reset signal is active.

FIG. 15 is a schematic diagram of a clock doubler circuit according to another embodiment of the invention. The clock doubler circuit of FIG. 15 does not provide DCC. Functionality the same as that of previous embodiments is not further described.

The circuit of FIG. 15 includes three counters 601 and 603–604 (which can be similar, for example, to counters 601 and 603–604 of FIGS. 6, 9, and 11), a divide-by-two register 1103 (which can be similar, for example, to register 1103 of FIG. 11), a reset circuit (flip-flop 606 and inverter 609, similar to the elements of FIGS. 6, 9, and 11), an output clock generator (elements 608 and 610–611), and inverter 1501. The circuit of FIG. 15 does not include an equivalent counter to counter 2 of FIGS. 6, 9, and 11.

Counter 1 (601) functions in the same fashion as in FIGS. 6, 9, and 11. Thus, the number of counts P is provided on output terminals QC[N:0]. The number of counts P can be recounted, for example, every fifth clock cycle. The number of counts P is provided to divide-by-two register 1103, where the value is divided by two (e.g., by shifting by one bit towards the LSB) and stored.

When signal CLKIN pulses high, the high pulse is echoed on output terminal CLK2X (via NOR gate 611 and inverter 610). To provide the clock doubler function, a second clock pulse must be generated halfway through the input clock cycle.

Counter 3 (603) starts counting when input clock signal CLKIN (ClkStart) goes high, and compares the count value with the value stored in divide-by-two register 1103. Thus, the count value is compared to one-half of the count value P (i.e., P/2). When the value in counter 3 reaches this stop value, counter 3 (603) provides a high output pulse on signal SET180. The high output pulse clocks the power high VDD value into flip-flop 608, driving signal CLK180 high. The high output pulse also resets counter 3. In response, NOR gate 611 provides a low value to inverter 610, which drives output clock signal CLK2X high.

Counter 4 (604) starts counting when input clock signal CLKIN goes low (signal CLKIN inverted by inverter 1501 provides signal ClkStart), and compares the count value with the value stored in divide-by-two register 1103. Thus, the count value is compared to one-half of the count value P (i.e., P/2). When the value in counter 4 reaches this stop value, counter 4 (604) provides a high output pulse on signal RST180. The high output pulse resets flip-flop 608, driving signal CLK180 low. The high output pulse also resets counter 4. Because signal CLK0 is also low, NOR gate 611 provides a high value to inverter 610, which drives output clock signal CLK2X low.

Thus, each of counters 3 and 4 (603 and 604) provides a clock edge having the same polarity as signal CLKIN, but delayed from signal CLKIN by one-half a CLKIN clock period. Thus, the clock doubler of FIG. 15 does not provide DCC.

Note that in the pictured embodiment, when signal RST is high (active), signal RST2 is high, signal RST180 is high (because the two values being compared are both low, see FIG. 8), and signal CLK180 is low. Thus, output signal CLK2X is the same as input signal CLKIN.

Figure 16:
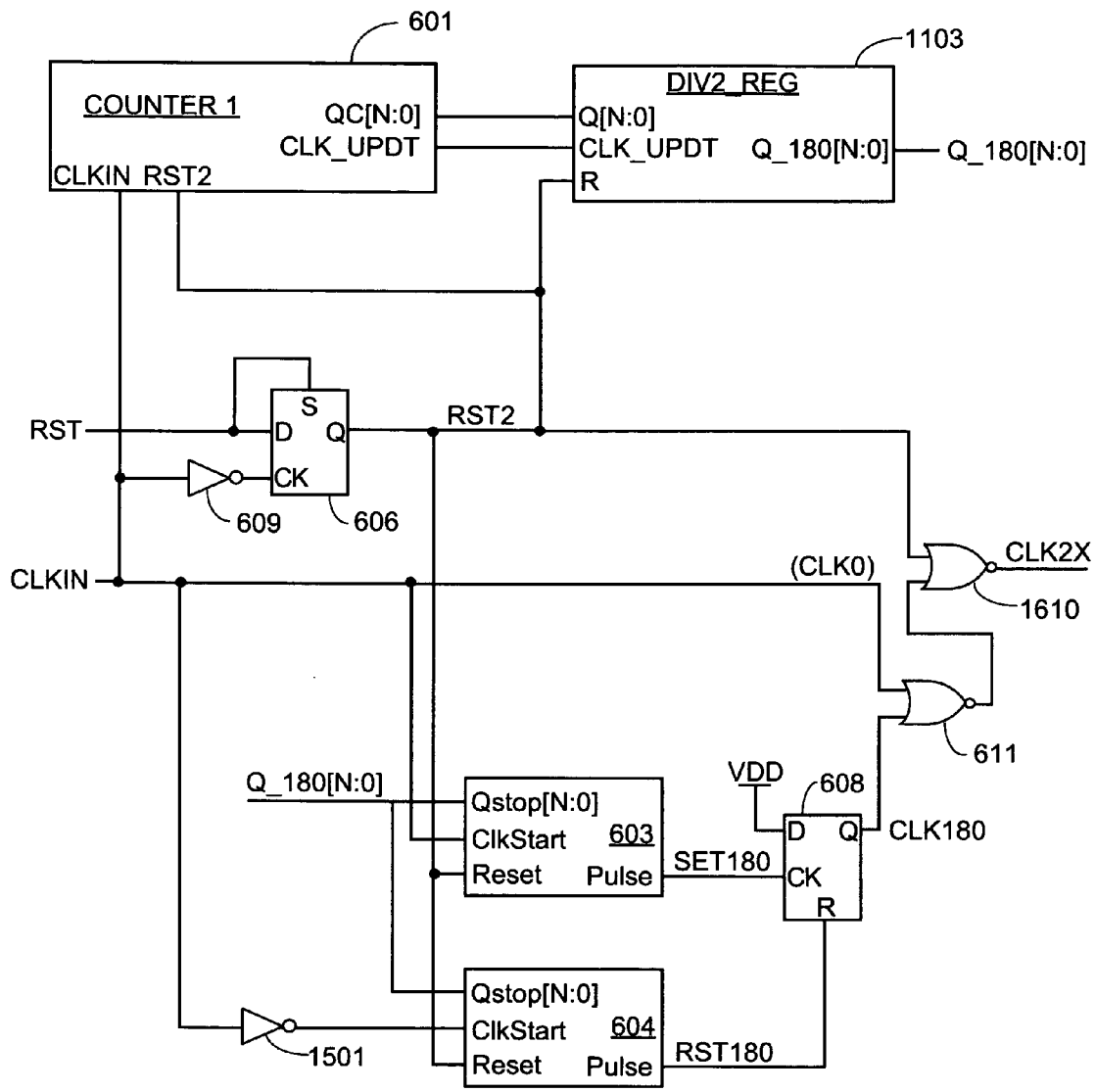
FIG. 16 is a schematic diagram of a clock doubler circuit according to an embodiment of the invention that does not provide DCC, and which provides a low value to the output clock terminal when a reset signal is active.

FIG. 16 shows a variation of the embodiment of FIG. 15 in which the output clock signal CLK2X is always low when signal RST is high. In the embodiment of FIG. 16, inverter 610 of FIG. 15 is replaced by a NOR gate 1610, driven by NOR gate 611 and by signal RST2. Thus, when signal RST goes high, signal RST2 goes high, and NOR gate 1610 drives signal CLK2X low.

Figure 17:
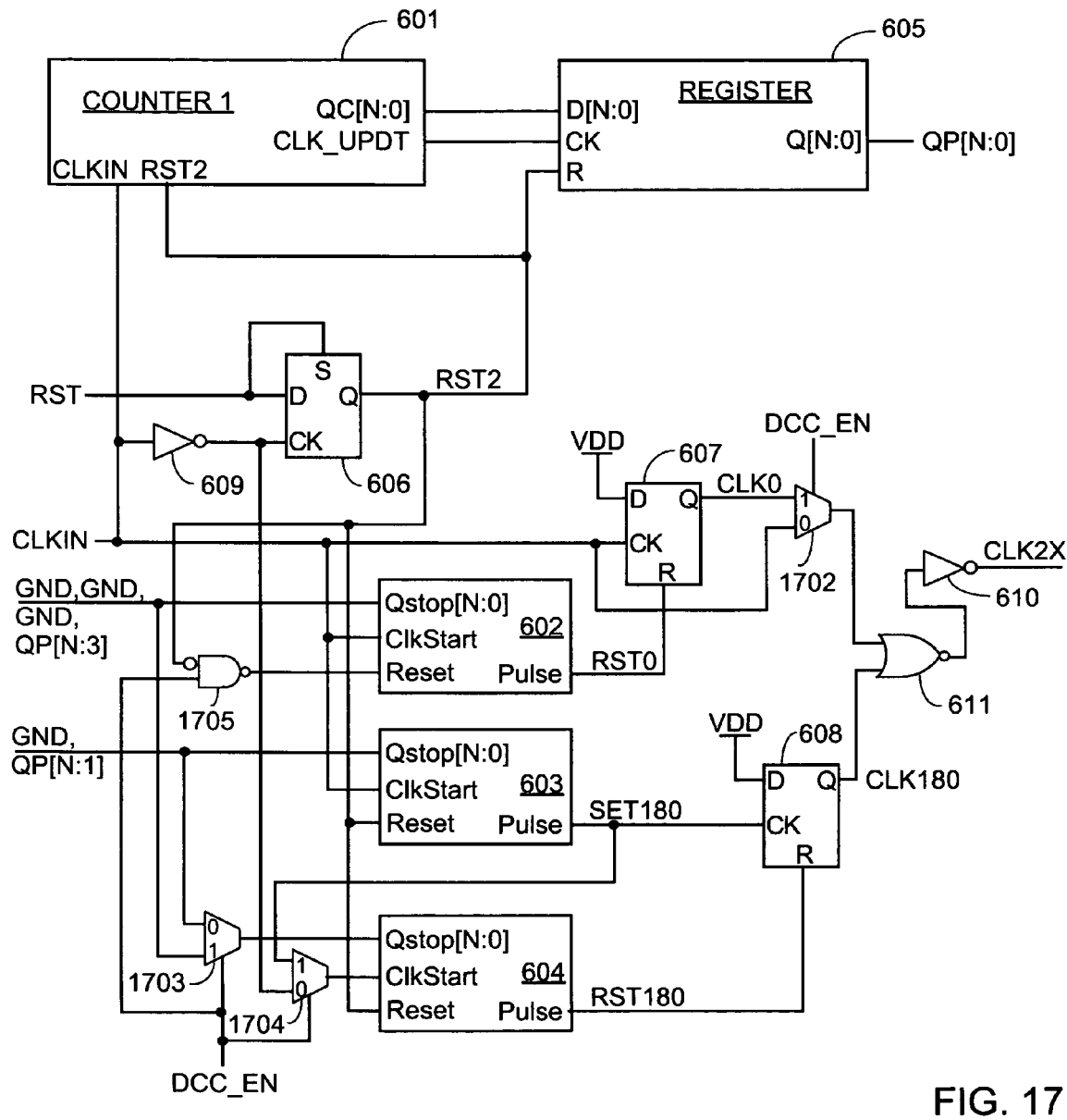
FIG. 17 is a schematic diagram of a clock doubler circuit according to an embodiment of the invention that optionally provides or does not provide DCC.

FIG. 17 is a schematic diagram of a clock doubler circuit according to an embodiment of the invention that optionally provides or does not provide DCC. The circuit of FIG. 17 is similar to the circuit of FIG. 9, with modifications that permit the optional selection of no DCC, as in FIG. 15. Only the differences from FIG. 9 are described.

In addition to the elements shown in FIG. 9, the circuit of FIG. 17 includes three multiplexers 1702–1704 and NAND gate 1705. Multiplexer 1702 is controlled by DCC enable signal DCC_EN to pass either signal CLK0 as in FIG. 9 (when signal DCC_EN is high) or signal CLKIN as in FIG. 15 (signal DCC_EN is low). Multiplexer 1703 is controlled by DCC enable signal DCC_EN to pass either signals GND, GND, GND, QP[N:3] as in FIG. 9 (when signal DCC_EN is high) or signals GND, QP[N:1], which are the equivalent signals to signals Q_180[N:0] in FIG. 15 (signal DCC_EN is low). Multiplexer 1704 is controlled by DCC enable signal DCC_EN to pass either signal SET180 as in FIG. 9 (when signal DCC_EN is high) or the inverse of signal CLKIN as in FIG. 15 (signal DCC_EN is low).

NAND gate 1705 is driven by signal DCC_EN and by the inverse of signal RST2. Thus, NAND gate 1705 controls the reset of counter 2 (602) by passing signal RST2 only when signal DCC_EN is high, i.e., when the DCC function is enabled. When signal DCC_EN is low (i.e., the DCC function is disabled), counter 2 (602) is always reset.

Figure 18:
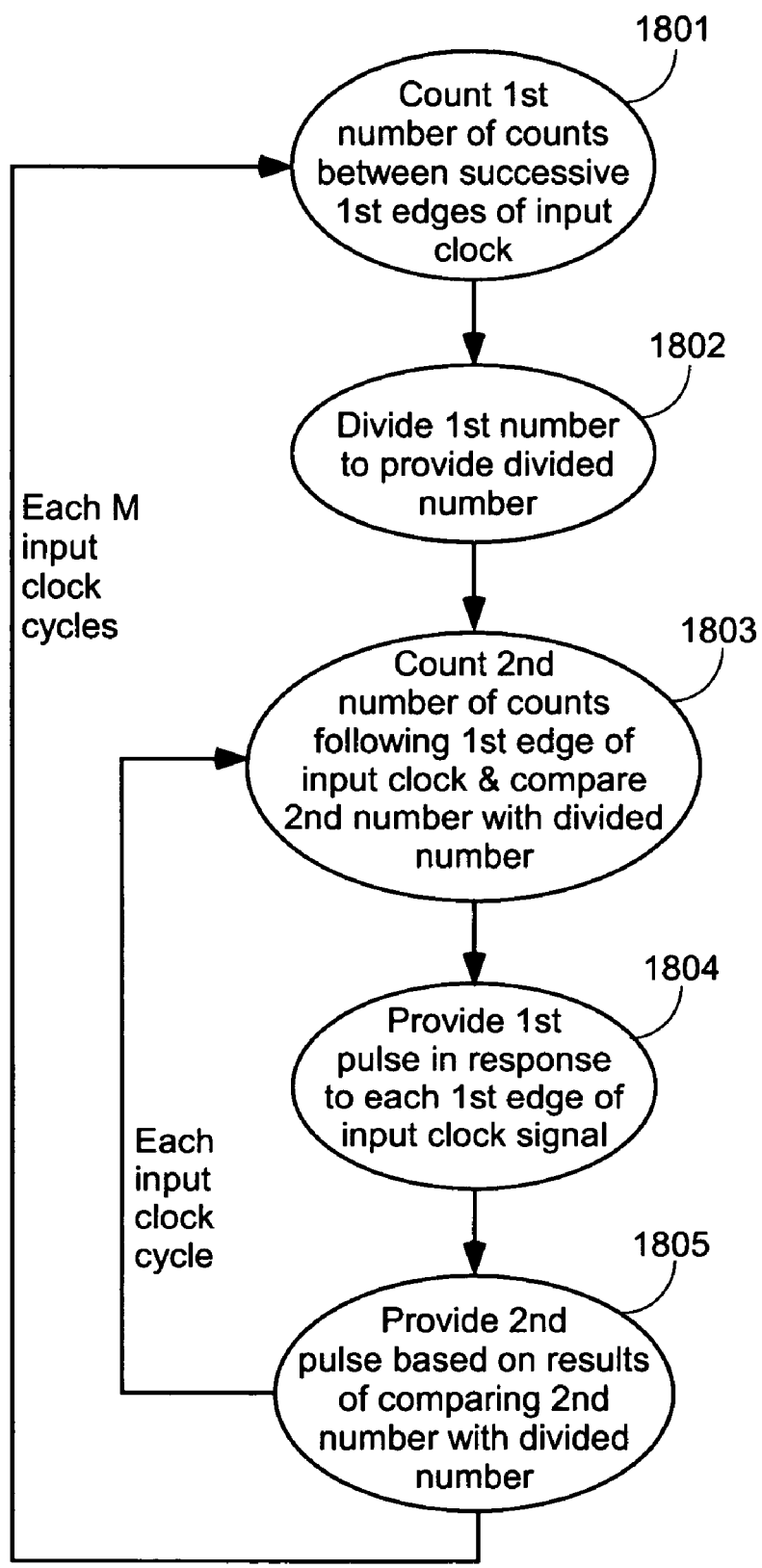
FIG. 18 illustrates the steps of a novel method of providing from an input clock signal an output clock signal having a frequency twice that of the input clock signal, according to another embodiment of the invention.

FIG. 18 illustrates the steps of a novel method of providing from an input clock signal an output clock signal having a frequency twice that of the input clock signal, according to another embodiment of the invention. The steps of FIG. 18 can be performed, for example, using any of the circuits illustrated in FIGS. 6–17. In some embodiments, the steps of FIG. 18 are performed by a circuit implemented in a programmable logic device (PLD), for example in a field programmable gate array (FPGA).

In step 1801, a first number of counts between successive first edges of an input clock signal is counted. For example, in the embodiment of FIG. 15, counter 1 (601) counts a number P of oscillator clock cycles within a single period of input clock signal CLKIN. In some embodiments, the first edges are rising edges.

In step 1802, the first number is divided to provide a divided number. In some embodiments, the number is stored, then is divided as it is passed to another circuit (e.g., as in the embodiments of FIGS. 6 and 9). In other embodiments, the number is divided prior to being stored in a register, as in the embodiments of FIGS. 11, 15, and 16. In some embodiments, the number is divided by a factor of two. In other embodiments, divisors other than two are used.

In step 1803, a second number of counts following each first edge of the input clock are counted, and the second number is compared with the divided number.

In step 1804, a first pulse is provided on an output clock signal in response to each first edge of the input clock signal.

In step 1805, a second pulse is provided on the output clock signal based on the results of comparing the second number with the divided number. In some embodiments, the second pulse is provided whenever the second number is the same as the divided number. In some embodiments, the second pulse is provided whenever the second number is the same as the divided number plus an offset value. In some embodiments, the second pulse is provided whenever the second number is the same as the divided number minus an offset value.

In some embodiments, the first number of counts is repeated every M periods of the input clock signal, where M is an integer. In some embodiments, M is five.

In some embodiments, the output clock signal has a predefined duty cycle independent of a duty cycle of the input clock signal. For example, the duty cycle of the output clock signal can be 50 percent, 25 percent, or some other desired value.

Figure 19:
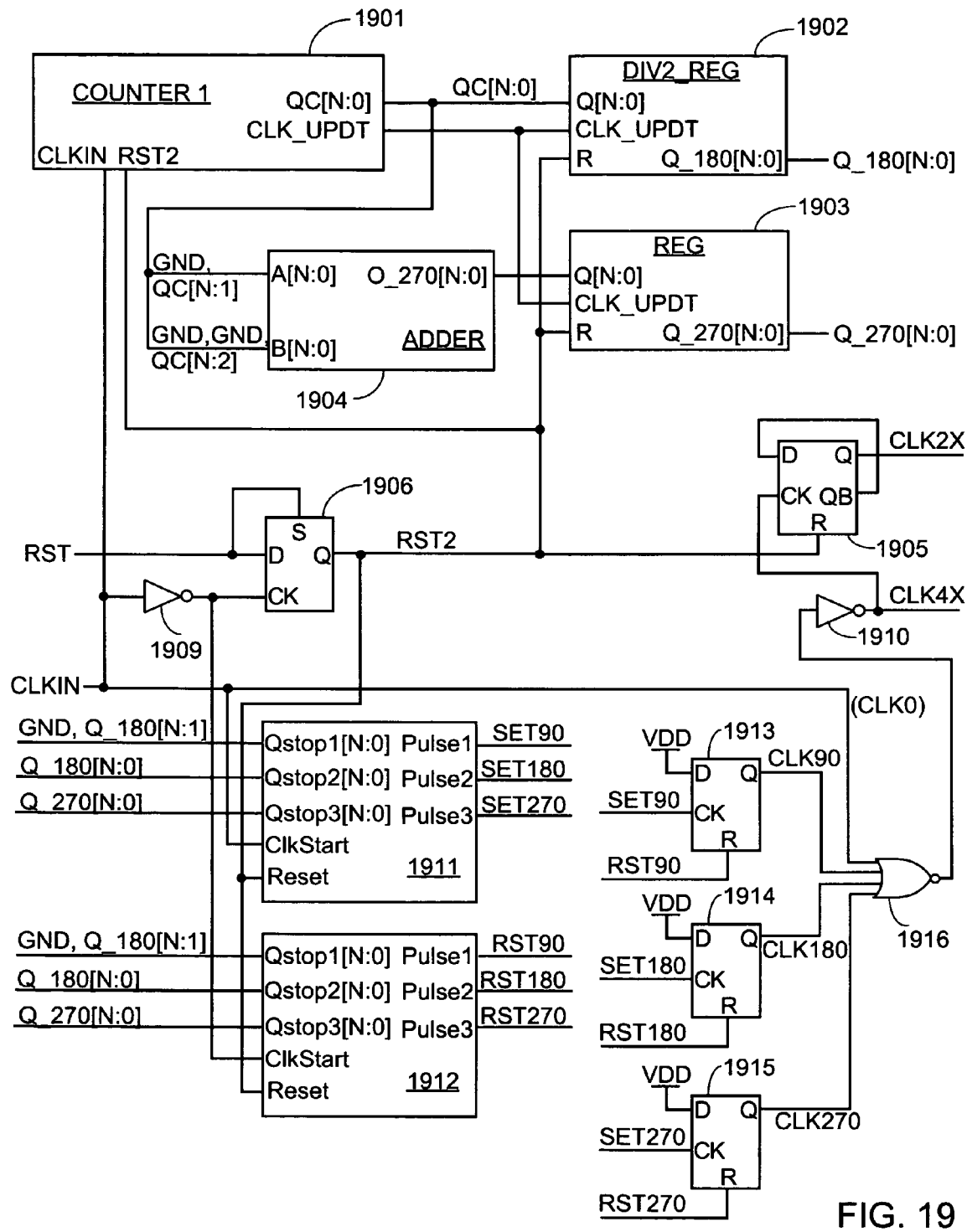
FIG. 19 is a schematic diagram of a clock 4× multiplier circuit according to an embodiment of the invention that provides DCC having a duty cycle not necessarily equal to 50 percent.

FIG. 19 illustrates a clock 4× multiplier circuit according to an embodiment of the present invention. The clock 4× multiplier circuit of FIG. 19 provides an output clock signal having a predefined duty cycle, but the duty cycle is not necessarily a 50 percent duty cycle. Instead, the pulse width of the output clock signal is the same as the pulse width of the input clock signal. Therefore, a disadvantage of the circuit of FIG. 19 is that the duty cycle of the input clock signal CLKIN must be less than 25 percent (i.e., the high pulse must be less than one fourth of the input clock period). Advantages of the circuit include its simplicity and small size.

Figure 20:
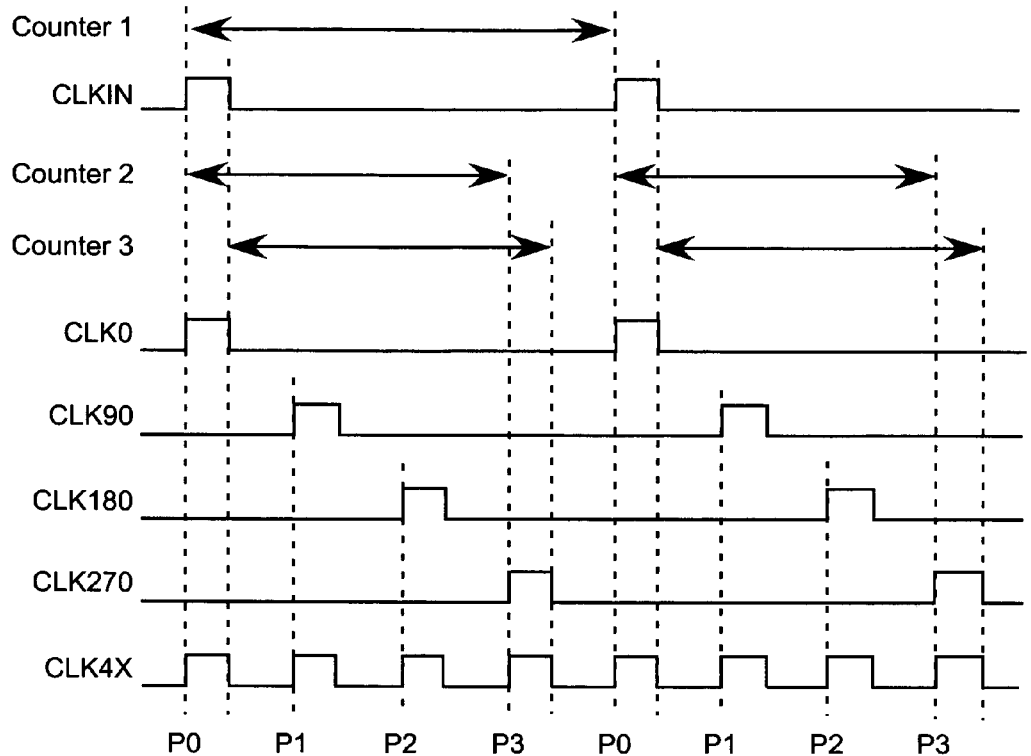
FIG. 20 is a timing diagram for the clock 4× multiplier circuit of FIG. 19.

FIG. 19 is a schematic diagram of a clock 4× multiplier circuit according to one embodiment of the invention that includes three counters 1901, 1911, and 1912, a divide-by-two register 1902, an adder 1904, a register 1903, a reset circuit (flip-flop 1906 and inverter 1909), and an output clock generator (elements 1905, 1910, and 1913–1916). The circuit of FIG. 19 operates as shown in FIG. 20. Thus, the combination of FIGS. 19 and 20 should be consulted in conjunction with the following explanation of the circuit of FIG. 19.

Counter 1 (1901) uses a relatively faster clock signal to count a number of counts P in one period of input clock signal CLKIN. Counter 1 can be implemented, for example, in a similar fashion to counter element 601 of FIG. 6. The number of counts P (represented by signals QC[N:0]) is divided by two and stored in divide-by-two register 1902 as signals Q_180[N:0]. Register 1902 can be implemented, for example, in a similar fashion to the register illustrated in FIG. 14. The number of counts P is also divided by two (by shifting the bits by one and dropping the least significant bit) and divided by four (by shifting the bits by two and dropping the two least significant bits). The two resulting values are added together in adder 1904, and the resulting value O_270[N:0] (which represents three-quarters of the number of counts P) is stored in register 1903 as signals Q_270[N:0].

At time P0 (see FIG. 20), a high pulse appears on input clock signal CLKIN. The high pulse appears at the output clock terminal CLK4X, having traversed NOR gate 1916 and inverter 1910.

Counters 2 and 3 (1911 and 1912, respectively) are clocked by similar faster clock signals (e.g., generated by oscillator circuits having the same design and configuration as the oscillator circuit in counter 1). Counter 2 (1911) starts counting when input clock signal CLKIN (ClkStart) goes to a first value (e.g., high), and compares the count value with three different stop values. In a first comparator, the count value is compared with one-half of the value stored in divide-by-two register 1902 (i.e., P/4). Note that in making this comparison counter 2 does not use the least significant bit from register 1902, thus dividing the original count value (P) by four to provide the first counter stop value Qstop1 [N:0]. When the value in counter 2 reaches P/4 (at time P1 of FIG. 20), counter 2 (1911) provides a high output pulse on signal SET90. The high pulse on signal SET90 clocks a high value into flip-flop 1913, driving signal CLK90 high at time P1, as shown in FIG. 20. Therefore, signal CLK4X is driven high at time P1 through NOR gate 1916 and inverter 1910.

Counter 3 performs a similar counting and comparison process, but begins the counting and comparison in response to a second (e.g., falling) edge of input clock signal CLKIN. Thus, one fourth of an input clock period after the first falling edge of input clock signal CLKIN, counter 3 provides a pulse on signal RST90. The high pulse on signal RST90 resets flip-flop 1913, placing a low value on output signal CLK4X.

Counter 2 continues to count, and a second comparator compares the count value with the value stored in divide-by-two register 1902 (i.e., P/2). Note that in making this comparison counter 2 uses all of the bits from register 1902, thus dividing the original count value (P) by two to provide the second counter stop value Qstop2[N:0]. When the value in counter 2 reaches P/2 (at time P2 of FIG. 20), counter 2 (1911) provides a high output pulse on signal SET180. The high pulse on signal SET180 clocks a high value into flip-flop 1914, driving signal CLK180 high at time P2, as shown in FIG. 20. Therefore, signal CLK4X is driven high at time P2 through NOR gate 1916 and inverter 1910.

Meanwhile, counter 3 continues to perform a similar counting and comparison process. Thus, one half clock period after the first falling edge of input clock signal CLKIN, counter 3 provides a pulse on signal RST180. The high pulse on signal RST180 resets flip-flop 1914, placing a low value on output signal CLK4X.

Counter 2 continues to count, and a third comparator compares the count value with the value stored in three-quarters register 1903 (i.e., 3P/4). Note that in making this comparison counter 2 uses all of the bits from register 1903 to provide stop value Qstop3[N:0]. When the value in counter 2 reaches 3P/4 (at time P3 of FIG. 20), counter 2 (1911) provides a high output pulse on signal SET270. The high pulse on signal SET270 clocks a high value into flip-flop 1915, driving signal CLK270 high at time P3, as shown in FIG. 20. Therefore, signal CLK4X is driven high at time P3 through NOR gate 1916 and inverter 1910. The pulse on signal SET270 also resets counter 2.

Meanwhile, counter 3 continues to perform a similar counting and comparison process. Thus, three-quarters of one input clock period after the first falling edge of input clock signal CLKIN, counter 3 provides a high output pulse on signal RST270. The high pulse on signal RST270 resets flip-flop 1915, placing a low value on output signal CLK4X. The pulse on signal RST270 also resets counter 3.

The pictured embodiment also provides a divided-by-two output clock signal CLK2X from output clock signal CLK4X. Signal CLK2X is generated using a well-known divide-by-two clock divider implementation, a toggle flip-flop 1905 clocked by signal CLK4X.

In the pictured embodiment, the reset signal for each of counters 1–3 (1901, 1911, and 1912), registers 1902, 1903, and flip-flop 1905 is signal RST2, which is provided by flip-flop 1906. Whenever a global reset signal RST is high (active), flip-flop 1906 ensures that signal RST2 is also high. Whenever the global reset signal RST is low (inactive), flip-flop 1906 clocks in the low value and drives signal RST2 low on the next falling edge of signal CLKIN.

In one embodiment, counter 1 (1901) is designed to recount the length of the input clock pulse (i.e., to generate a new value of P) every fifth clock cycle. In other embodiments, the periodicity of the count has other values, e.g., the desired periodicity can be selected based on the stability of the input clock frequency. In other embodiments, other implementations of counter circuit 1901 are used. Any appropriate embodiment can be used.

Figure 21:
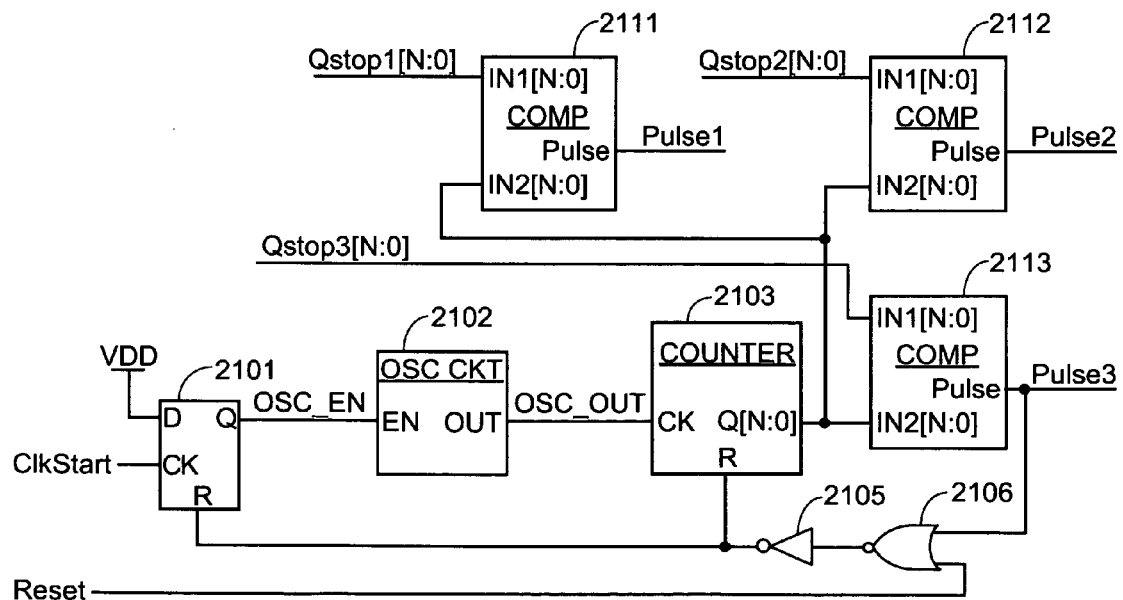
FIG. 21 is a schematic diagram of a counter circuit that can optionally be used in the embodiment of FIG. 19.

FIG. 21 is a schematic diagram of one counter embodiment that can be used to implement counters 1911–1912 of FIG. 19. This embodiment can be used, for example, when counter 1901 is implemented as shown in FIG. 6 (element 601). The counter of FIG. 21 includes a reset flip-flop 2101, an oscillator circuit 2102, a counter 2103, three comparators 2111–2113, a NOR gate 2106, and an inverter 2105. The counter shown in FIG. 21 is similar to the counter shown in FIG. 8, and operates in a similar fashion. However, the counter shown in FIG. 8 performs only one comparison, and provides only one output pulse. The counter shown in FIG. 21 performs three comparisons, and provides three different output pulses.

Comparator 2111 provides a high pulse on signal Pulse1 when the count value in counter 2103 matches one-fourth of the input clock count P. Comparator 2112 provides a high pulse on signal Pulse2 when the count value in counter 2103 matches one-half of the input clock count P. Comparator 2113 provides a high pulse on signal Pulse3 when the count value in counter 2103 matches three-quarters of the input clock count P. As previously described, a high pulse on signal Pulse3 also resets counter 2103.

Any known oscillator circuit can be used to implement oscillator circuit 2102 of FIG. 21 and the oscillator circuit in counter 1 (1901 in FIG. 19). Preferably, the same implementation is used for all of the oscillator circuits in the clock multiplier, as this approach creates a high correlation between the oscillators irregardless of external factors such as processing and temperature variations. For example, the well known ring oscillator design (e.g., a loop including an odd number of logic gates, e.g., two inverters and a NAND gate driven by the enable signal) can be used. This embodiment is particularly useful when the clock multiplier circuit is implemented in a PLD, because the oscillator can be implemented using the programmable logic blocks of the PLD. In some embodiments, external oscillators are used.

Any known counter or counters can be used to implement counter 2103 of FIG. 21. For example, a well known ripple counter can be used. In some embodiments, double-edge flip-flops are used to double the count stored in the counter. In some embodiments, a first subset of the counters use double-edge flip-flops with a first oscillator frequency, while a second subset of the counters use single-edge flip-flops with a second oscillator frequency twice that of the first oscillator frequency.

Any known comparator can be used to implement comparators 2111–2113 of FIG. 21. For example, the well known exclusive-NOR (XNOR) implementation can be used, wherein each pair of bits is provided to an XNOR gate, the XNOR gates are combined using NAND gates, and the NAND gates each drive a NOR gate providing the Pulse output signals in FIG. 21.

Figure 22:
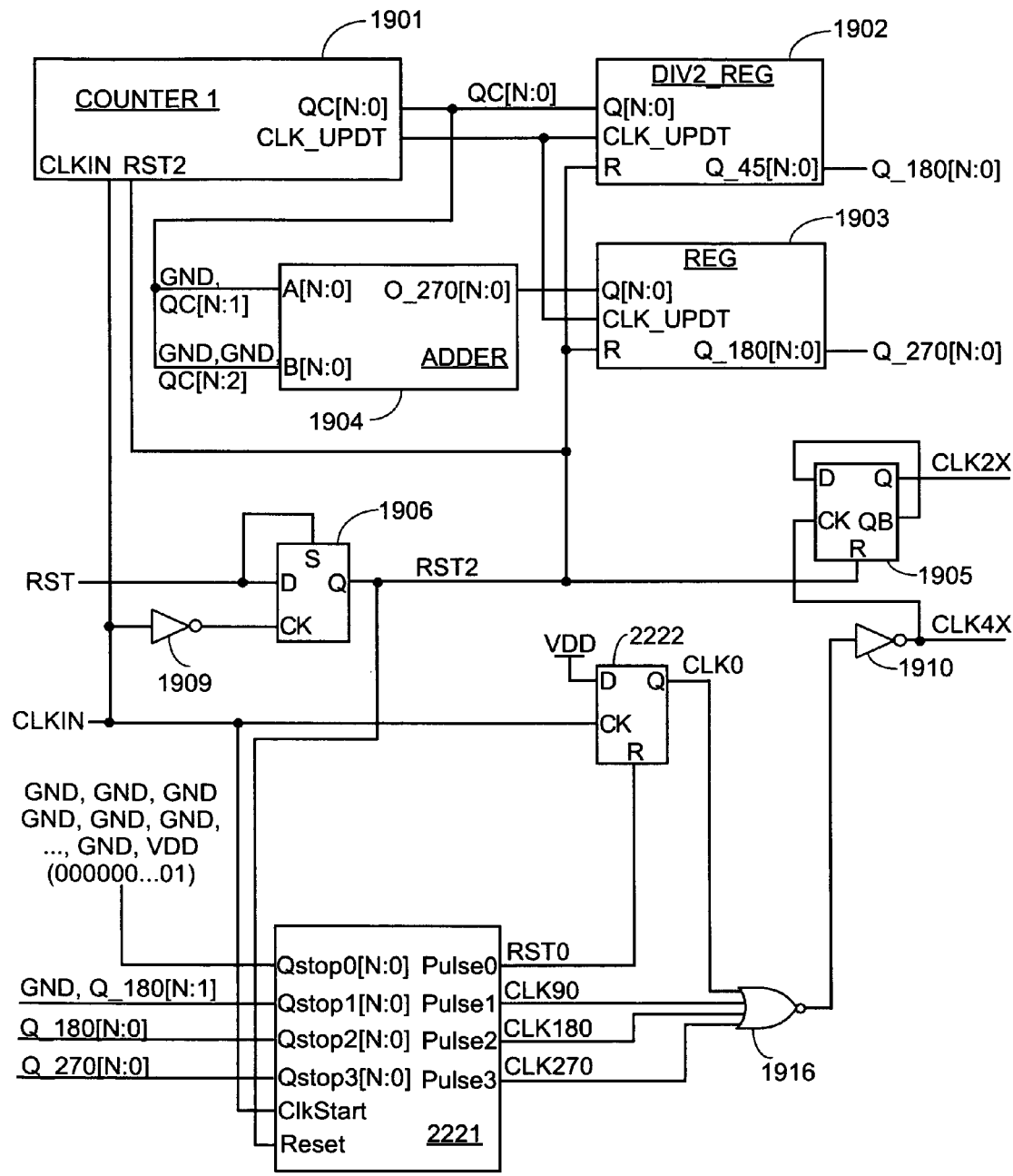
FIG. 22 is a schematic diagram of a clock 4× multiplier circuit according to another embodiment of the invention that provides DCC having a duty cycle not necessarily equal to 50 percent.

FIG. 22 is a schematic diagram of a clock 4× multiplier circuit according to another embodiment of the invention. The clock 4× multiplier circuit of FIG. 22 provides an output clock signal having a predefined duty cycle, but the duty cycle is not necessarily a 50 percent duty cycle. Instead, the pulse width of the output clock signal is about the same as the period of the oscillator clock signal. In this embodiment, the input clock signal CLKIN can have any duty cycle, e.g., the duty cycle need not be less than 25 percent as is required by the embodiment of FIG. 19. The embodiment of FIG. 22 is similar in some respects to that of FIG. 19, and functionality similar to that of FIG. 19 is not further described.

In the embodiment of FIG. 22, counters 2 and 3 (counters 1911 and 1912 of FIG. 19) are replaced by a single counter 2221. Counter 2221 has four stop values, Qstop0[N:0], Qstop1[N:0], Qstop2[N:0], and Qstop3[N:0]. Stop value Qstop0[N:0] is all zeros except for the least significant bit. Therefore, stop value Qstop0[N:0] occurs shortly after receipt of a first (e.g., rising) edge on input clock signal CLKIN, and is used to provide a high pulse on signal Pulse0 (RST0).

Stop value Qstop1[N:0] is the value stored in divide-by-two register 1902, divided again by two. (Note that the bits from register 1902 are shifted by one bit before being provided to counter 2221.) Thus, stop value Qstop1[N:0] is the number of counts in the input clock period (P) divided by four, or P/4. Counter 2221 uses stop value Qstop1[N:0] to provide a high pulse on signal Pulse1 (CLK90) one-fourth of the way through the input clock cycle.

Stop value Qstop2[N:0] is the value stored in divide-by-two register 1902. Thus, stop value Qstop2[N:0] is the number of counts in the input clock period (P) divided by two, or P/2. Counter 2221 uses stop value Qstop2[N:0] to provide a high pulse on signal Pulse2 (CLK180) one-half of the way through the input clock cycle.

Stop value Qstop3[N:0] is the value stored in three-quarter register 1903. Thus, stop value Qstop3[N:0] is three-fourths of the number of counts in the input clock period, or 3P/4. Counter 2221 uses stop value Qstop3[N:0] to provide a high pulse on signal Pulse3 (CLK270) three-quarters of the way through the input clock cycle.

When signal CLKIN goes high, flip-flop 2222 clocks in the high value from power high VDD, and signal CLK0 goes high. Thus, signal CLK4X goes high, driven by signal CLK0 through NOR gate 1916 and inverter 1910. Shortly thereafter, as previously described, signal RST0 goes high and resets flip-flop 2222. Thus, signal CLK4X goes low, driven by signal CLK0 through NOR gate 1916 and inverter 1910.

One-quarter of the way through the input clock cycle, signal Pulse1 pulses high with a predefined pulse width. (Preferably the pulse widths are the same for all of signals Pulse0, Pulse1, Pulse2, and Pulse3, as these pulse widths determine the pulse widths of the output clock signal CLK4X.) Thus, signal CLK90 pulses high, driving output signal CLK4X high through NOR gate 1916 and inverter 1910. One-half of the way through the input clock cycle, signal Pulse2 pulses high with a predefined pulse width.

Thus, signal CLK180 pulses high, driving output signal CLK4X high through NOR gate 1916 and inverter 1910. Three-quarters of the way through the input clock cycle, signal Pulse3 pulses high with a predefined pulse width. Thus, signal CLK270 pulses high, driving output signal CLK4X high through NOR gate 1916 and inverter 1910.

Figure 23:
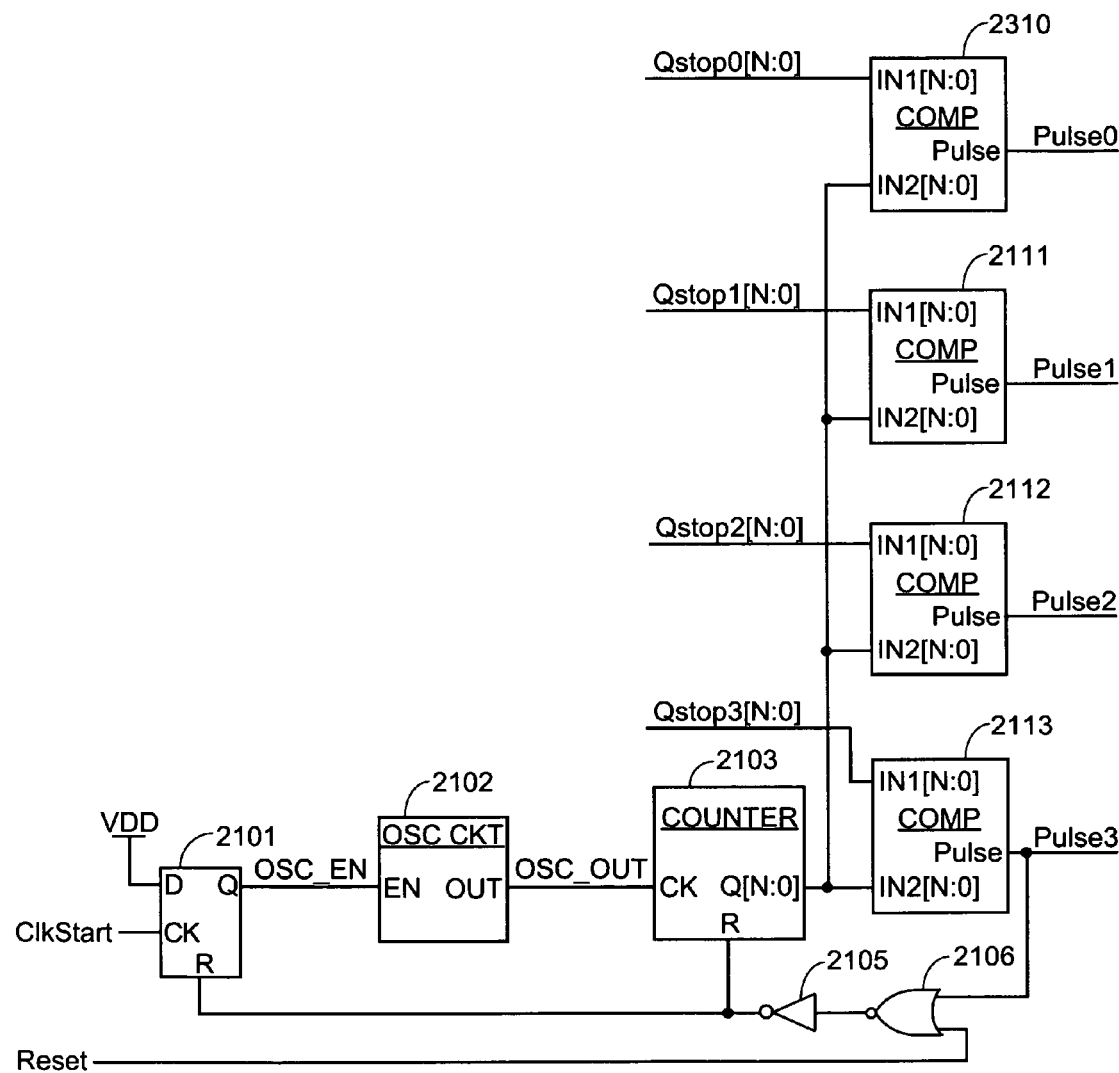
FIG. 23 is a schematic diagram of a counter circuit that can optionally be used in the embodiment of FIG. 22.

FIG. 23 is a schematic diagram of one counter embodiment that can be used to implement counter 2221 of FIG. 22. The embodiment of FIG. 23 is largely similar to that of FIG. 21, and functionality the same as that of FIG. 21 is not further described. The embodiment of FIG. 23 includes a fourth comparator 2310. Comparator 2310 provides a high pulse on signal Pulse0 when the count value in counter 2103 is all zeros except for the least significant bit, i.e., one oscillator clock period after receipt of a rising edge on input clock signal CLKIN. Thus, comparator 2310 provides signal RST0 in the embodiment of FIG. 22, resetting flip-flop 2222 and removing the high pulse on signal CLK0.

Figure 24:
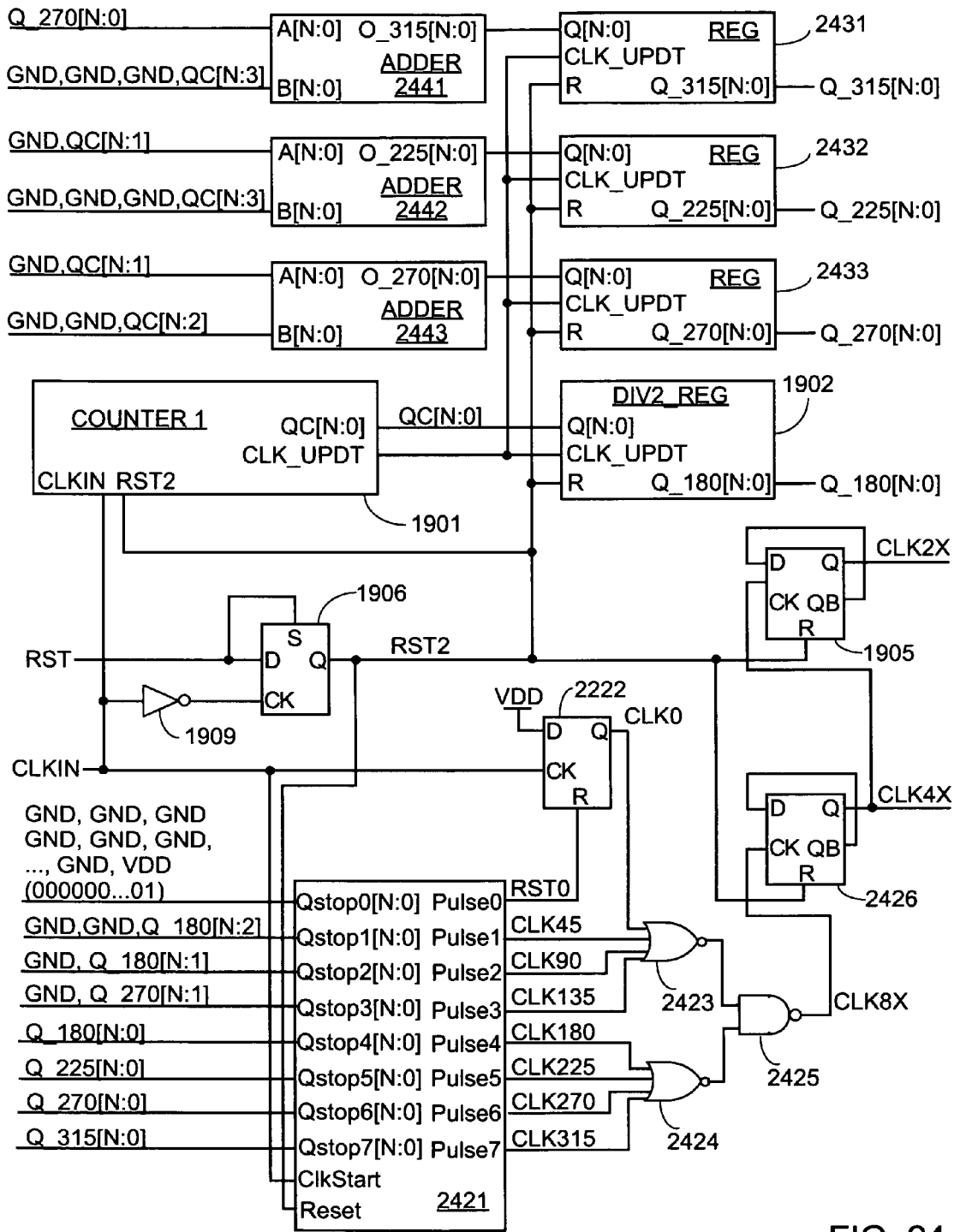
FIG. 24 is a schematic diagram of a clock 4× multiplier circuit according to an embodiment of the invention that provides DCC having a 50 percent duty cycle.

FIG. 24 is a schematic diagram of a clock 4× multiplier circuit according to another embodiment of the invention. The clock 4× multiplier circuit of FIG. 24 provides an output clock signal having a 50 percent duty cycle. The embodiment of FIG. 24 is similar in many respects to that of FIG. 22, and functionality similar to that of FIG. 22 is not further described. Comparing the embodiment of FIG. 24 with that of FIG. 22, counter circuit 2221 is replaced with counter circuit 2421, adder 1904 is replaced with adders 2441–2443, and register 1903 is replaced with registers 2431–2433. NOR gate 1916 and inverter 1910 are replaced with NOR gates 2423–2424, NAND gate 2425, and flip-flop 2426.

Adder 2443 adds the values of P/2 and P/4 to provide the value of 3P/4 (or 6P/8), represented by signals O_270[N:0]. This value is stored in three-quarter register 2433 as signals Q_270[N:0]. Adder 2442 adds the values of P/2 and P/8 to provide the value of 5P/8, represented by signals O_225[N:0]. This value is stored in five-eighths register 2432 as signals Q_225[N:0]. Adder 2441 adds the values of 3P/4 and P/8 to provide the value of 7P/8, represented by signals O_315[N:0]. This value is stored in seven-eighths register 2431 as signals Q_315[N:0].

Counter 2421 has eight stop values, Qstop0[N:0], Qstop1[N:0], Qstop2[N:0], Qstop3[N:0], Qstop4[N:0], Qstop5[N:0], Qstop6[N:0], and Qstop7[N:0]. Stop value Qstop0[N:0] is all zeros except for the least significant bit. Therefore, stop value Qstop0[N:0] occurs one oscillator clock period after receipt of a first (e.g., rising) edge on input clock signal CLKIN, and is used to provide a high pulse on signal Pulse0 (RST0).

Stop value Qstop1[N:0] is the value stored in divide-by-two register 1902, divided again by four. Thus, stop value Qstop1[N:0] is the number of counts in the input clock period (P) divided by eight, or P/8. Counter 2421 uses stop value Qstop1[N:0] to provide a high pulse on signal Pulse1 (CLK45) one-eighth of the way through the input clock cycle.

Stop value Qstop2[N:0] is the value stored in divide-by-two register 1902, divided again by two. Thus, stop value Qstop2[N:0] is the number of counts in the input clock period (P) divided by four, or P/4. Counter 2421 uses stop value Qstop2[N:0] to provide a high pulse on signal Pulse2 (CLK90) one-fourth of the way through the input clock cycle.

Stop value Qstop3[N:0] is the value stored in three-quarters register 2433, divided again by two. Thus, stop value Qstop3[N:0] is ⅜ of the number of counts in the input clock period (P), or 3P/8. Counter 2421 uses stop value Qstop3[N:0] to provide a high pulse on signal Pulse3 (CLK135) three-eighths of the way through the input clock cycle.

Stop value Qstop4[N:0] is the value stored in divide-by-two register 1902. Thus, stop value Qstop4[N:0] is the number of counts in the input clock period (P) divided by two, or P/2. Counter 2421 uses stop value Qstop4[N:0] to provide a high pulse on signal Pulse4 (CLK180) one-half of the way through the input clock cycle.

Stop value Qstop5[N:0] is the value stored in five-eighths register 2432. Thus, stop value Qstop5[N:0] is ⅝ of the number of counts in the input clock period (P), or 5P/8. Counter 2421 uses stop value Qstop5[N:0] to provide a high pulse on signal Pulse5 (CLK225) five-eighths of the way through the input clock cycle.

Stop value Qstop6[N:0] is the value stored in three-quarters register 2433. Thus, stop value Qstop6[N:0] is ¾ (⁶⁄₈) of the number of counts in the input clock period (P), or 3P/4. Counter 2421 uses stop value Qstop6[N:0] to provide a high pulse on signal Pulse6 (CLK270) three-quarters of the way through the input clock cycle.

Stop value Qstop7[N:0] is the value stored in seven-eighths register 2431. Thus, stop value Qstop7[N:0] is ⅞ of the number of counts in the input clock period (P), or 7P/8. Counter 2421 uses stop value Qstop7[N:0] to provide a high pulse on signal Pulse7 (CLK315) seven-eighths of the way through the input clock cycle.

Elements 2423–2425 constitute an 8-input logical OR gate. Signals CLK0, CLK45, CLK90, and CLK135 are NORed together using NOR gate 2423. Signals CLK180, CLK225, CLK270, and CLK315 are NORed together using NOR gate 2424. NOR gates 2423 and 2424 drive NAND gate 2425, which provides signal CLK8X. Thus, signal CLK8X is high whenever one of the signals CLK0, CLK45, CLK90, CLK135, CLK180, CLK225, CLK270, and CLK315 is high. In some embodiments, signal CLK8X is buffered and provided as an output signal from the clock multiplier circuit. In the pictured embodiment, signal CLK8X is divided by two using toggle flip-flop 2426 to provide output clock signal CLK4X.

Figure 25:
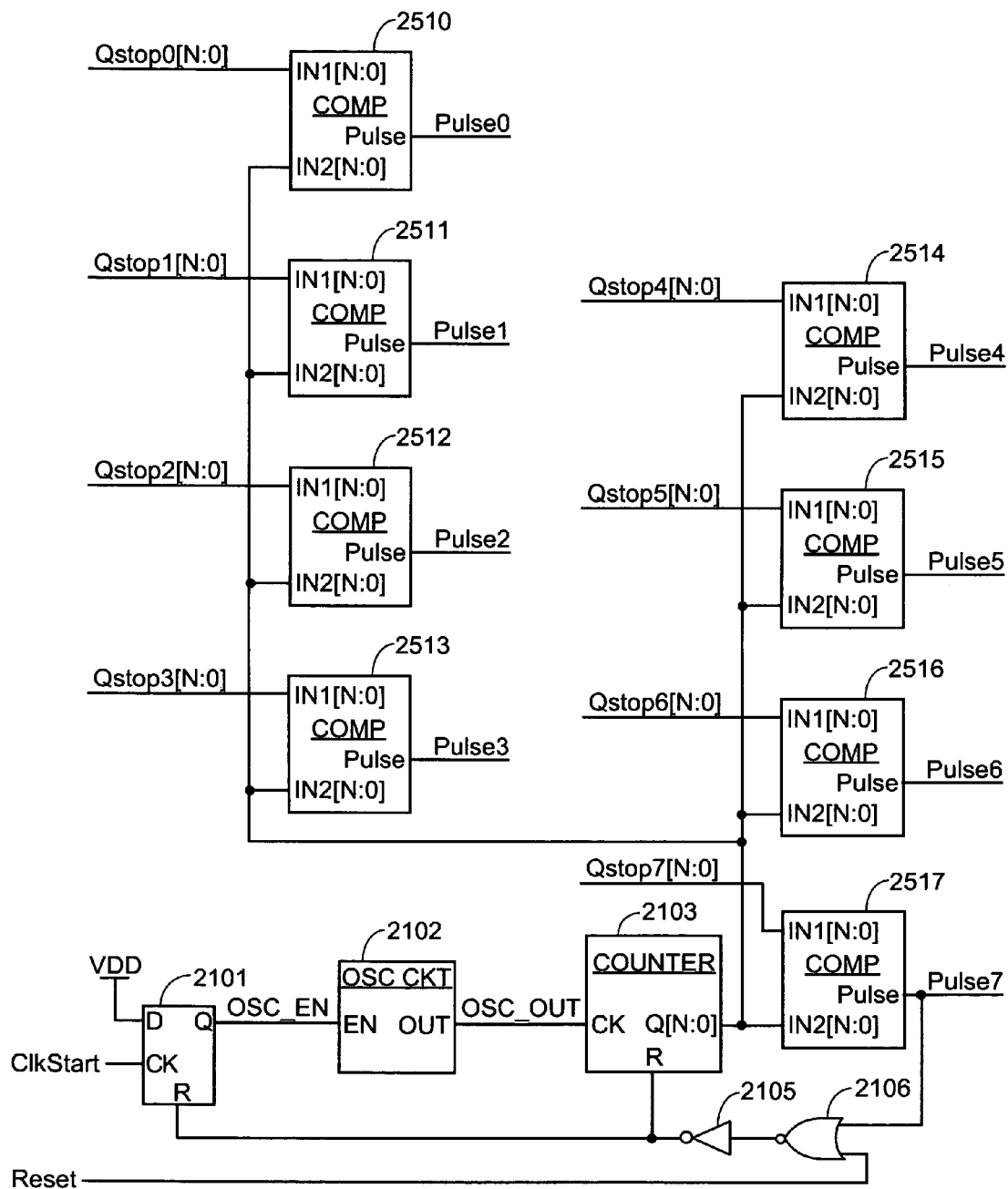
FIG. 25 is a schematic diagram of a counter circuit that can optionally be used in the embodiment of FIG. 24.

FIG. 25 is a schematic diagram of one counter embodiment that can be used to implement counter 2421 of FIG. 24. The embodiment of FIG. 25 is largely similar to that of FIG. 23, and functionality the same as that of FIG. 23 is not further described. The embodiment of FIG. 25 includes eight comparators 2510–2517. Comparator 2510 provides a high pulse on signal Pulse0 when the count value in counter 2103 is all zeros except for the least significant bit, i.e., one oscillator clock period after receipt of a rising edge on input clock signal CLKIN. Thus, comparator 2510 provides signal RST0 in the embodiment of FIG. 24, resetting flip-flop 2222 and removing the high pulse on signal CLK0.

Comparator 2511 provides a high pulse on signal Pulse1 when the count value in counter 2103 is P/8. Comparator 2512 provides a high pulse on signal Pulse2 when the count value in counter 2103 is P/4. Comparator 2513 provides a high pulse on signal Pulse3 when the count value in counter 2103 is 3P/8. Comparator 2514 provides a high pulse on signal Pulse4 when the count value in counter 2103 is P/2. Comparator 2515 provides a high pulse on signal Pulse5 when the count value in counter 2103 is 5P/8. Comparator 2516 provides a high pulse on signal Pulse6 when the count value in counter 2103 is 3P/4. Comparator 2517 provides a high pulse on signal Pulse7 when the count value in counter 2103 is 7P/8. The high pulse on signal Pulse7 also resets counter 2421.

Figure 26:
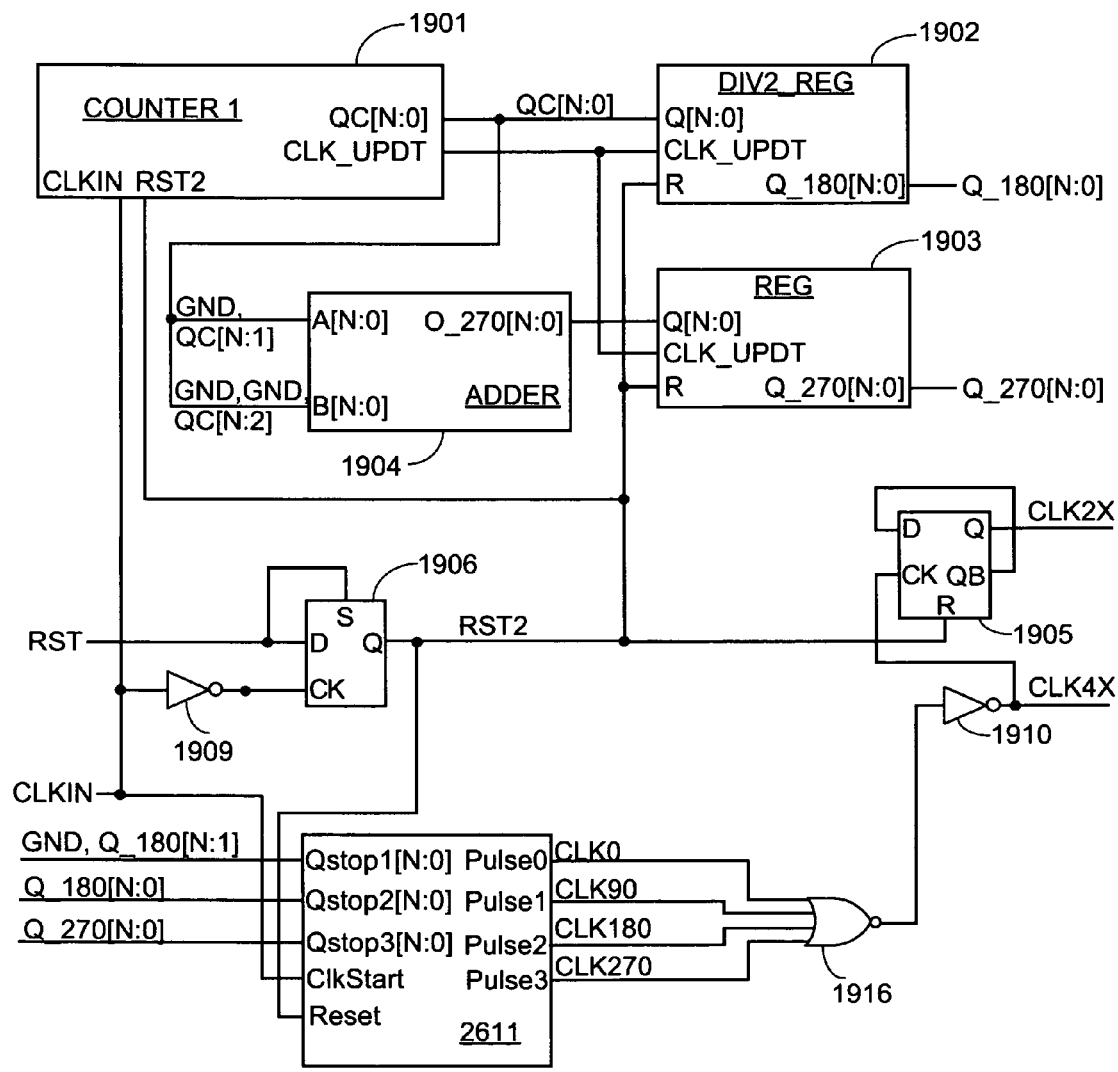
FIG. 26 is a schematic diagram of a clock 4× multiplier circuit according to yet another embodiment of the invention that provides DCC having a duty cycle not necessarily equal to 50 percent.

FIG. 26 is a schematic diagram of a clock 4× multiplier circuit according to another embodiment of the invention. The clock 4× multiplier circuit of FIG. 26 provides an output clock signal having a duty cycle that is not necessarily a 50 percent duty cycle. Instead, the pulse width of the output clock signal is about the same as the period of the oscillator clock signal. The embodiment of FIG. 26 is similar in many respects to that of FIG. 22, and functionality similar to that of FIG. 22 is not further described. Comparing the embodiment of FIG. 26 with that of FIG. 22, counter circuit 2221 is replaced with counter circuit 2611 and flip-flop 2222 is removed.

Figure 27:
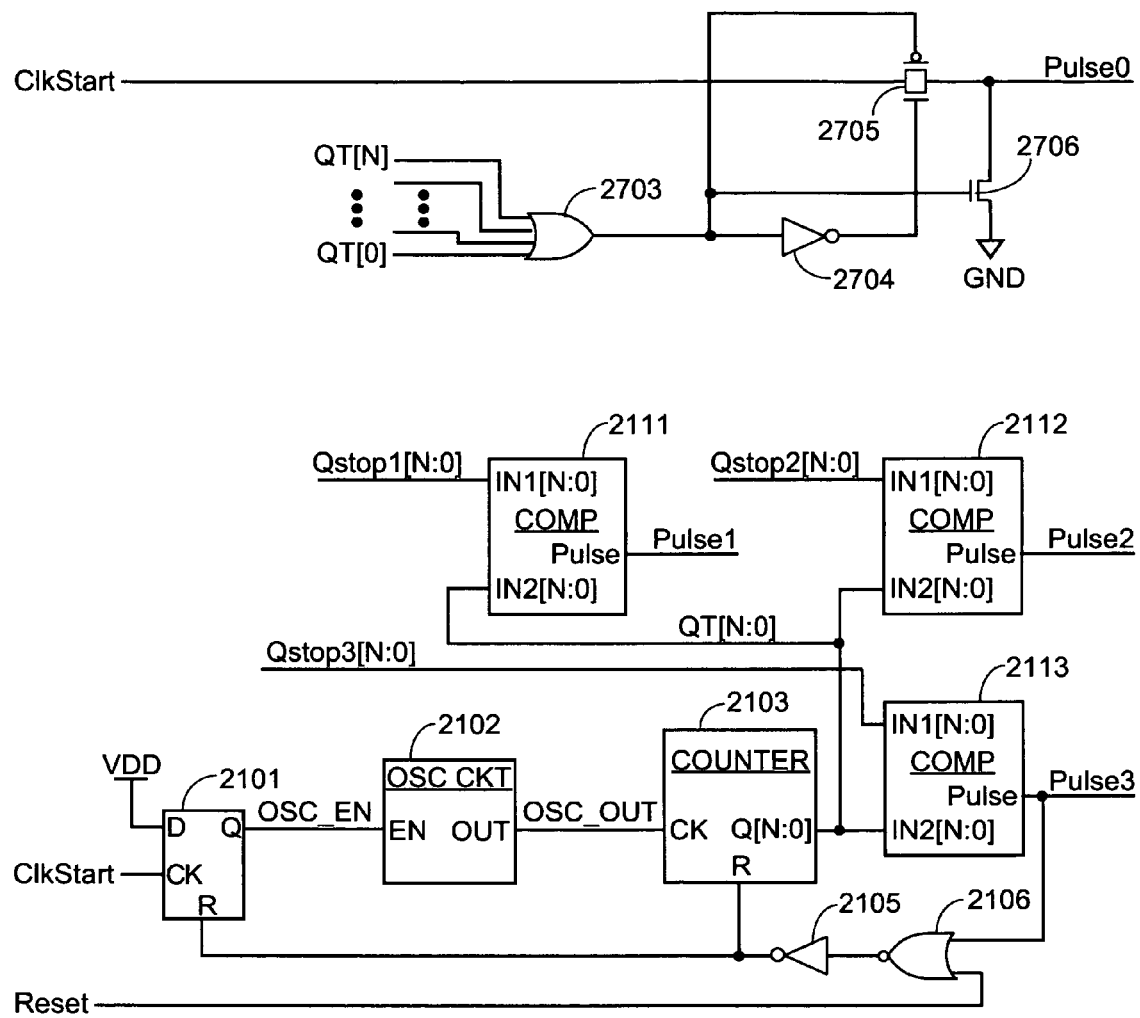
FIG. 27 is a schematic diagram of a counter circuit that can optionally be used in the embodiment of FIG. 26.

Counter circuit 2611 provides signal CLK0 directly (as signal Pulse0), instead of providing a reset pulse to flip-flop 2222. Signal CLK0 is generated as shown in FIG. 27 and described below with respect to that figure.

Counter 2421 has three stop values, Qstop1[N:0], Qstop2[N:0], and Qstop3[N:0]. Stop value Qstop1[N:0] is the value stored in divide-by-two register 1902, divided again by two. Thus, stop value Qstop1[N:0] is the number of counts in the input clock period (P) divided by four, or P/4. Counter 2611 uses stop value Qstop1[N:0] to provide a high pulse on signal Pulse1 (CLK90) one-fourth of the way through the input clock cycle.

Stop value Qstop2[N:0] is the value stored in divide-by-two register 1902. Thus, stop value Qstop2[N:0] is the number of counts in the input clock period (P) divided by two, or P/2. Counter 2611 uses stop value Qstop2[N:0] to provide a high pulse on signal Pulse2 (CLK180) one-half of the way through the input clock cycle.

Stop value Qstop3[N:0] is the value stored in three-quarters register 1903. Thus, stop value Qstop3[N:0] is ¾ of the number of counts in the input clock period (P), or 3P/4. Counter 2611 uses stop value Qstop3[N:0] to provide a high pulse on signal Pulse3 (CLK270) three-fourths of the way through the input clock cycle.

Signals CLK0, CLK90, CLK180, and CLK270 are NORed together using NOR gate 1916, the output of which is inverted by inverter 1910 to provide output clock signal CLK4X. Thus, a high pulse on any of these four clock signals results in a high pulse on output clock signal CLK4X.

FIG. 27 is a schematic diagram of one counter embodiment that can be used to implement counter 2611 of FIG. 26. The embodiment of FIG. 27 is largely similar to that of FIG. 21, and functionality the same as that of FIG. 21 is not further described. However, the counter circuit of FIG. 27 includes elements 2703–2706, which together result in the generation of signal Pulse0 (CLK0).

Signals QT[N:0] from counter 2103 are ORed together in OR gate 2703. Thus, OR gate 2703 provides a high value at all times except when counter 2103 is reset (i.e., signals QT[N:0] are all low). Hence, OR gate 2703 turns on transistor 2706, pulling signal Pulse0 to ground GND (low), at all times except when counter 2103 is reset.

When counter 2103 is reset, OR gate 2703 provides a low value to turn off transistor 2706 and turn on pass transistor 2705 (in conjunction with inverter 2704). Thus, signal ClkStart (CLKIN) is passed to signal Pulse0 (CLK0) until a non-zero value appears in counter 2103.

Figure 28:
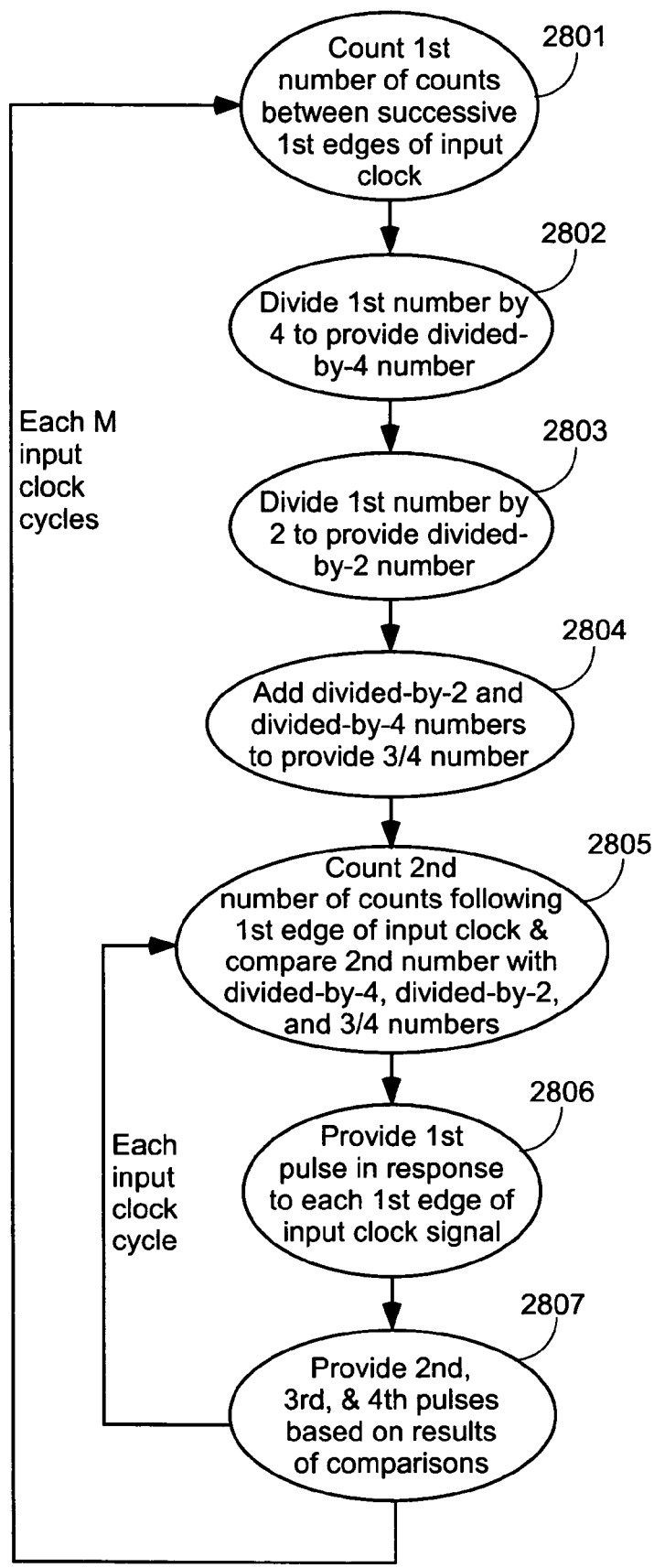
FIG. 28 illustrates the steps of a novel method of providing from an input clock signal an output clock signal having a higher frequency than the input clock signal, according to another embodiment of the invention.

FIG. 28 illustrates the steps of a novel method of providing from an input clock signal an output clock signal having a higher frequency than the input clock signal, according to another embodiment of the invention. The steps of FIG. 28 can be performed, for example, using the circuits illustrated in FIGS. 19–27. In some embodiments, the steps of FIG. 28 are performed by a circuit implemented in a programmable logic device (PLD), for example in a field programmable gate array (FPGA).

In step 2801, a first number of counts between successive first edges of an input clock signal is counted. For example, when counter 1 is implemented as shown in FIG. 6 (element 601), counter 1 counts a number P of oscillator clock cycles within a single period of input clock signal CLKIN. In some embodiments, the first edges are rising edges.

In step 2802, the first number is divided by four to provide a divided-by-four number. In some embodiments, the first number is stored, then is divided as it is passed to another circuit. In some embodiments, the first number is divided prior to being stored in a register. In some embodiments, the first number is divided by two, stored, then divided by two again as it is passed to another circuit.

In step 2803, the first number is divided by two to provide a divided-by-two number. In some embodiments, the first number is stored, then is divided as it is passed to another circuit. In some embodiments, the first number is divided prior to being stored in a register. Steps 2802 and 2803 can occur in any order, or simultaneously.

In step 2804, the divided-by-two and divided-by-four numbers are added to provide a three-quarter number.

In step 2805, a second number of counts following each first edge of the input clock are counted, and the second number is compared with the divided-by-four number, the divided-by-two number, and the three-quarter number.

In step 2806, a first pulse is provided on an output clock signal in response to each first edge of the input clock signal.

In step 2807, second, third, and fourth pulses are provided on the output clock signal. The second pulse is provided based on the results of comparing the second number with the divided-by-four number. The third pulse is provided based on the results of comparing the second number with the divided-by-two number. The fourth pulse is provided based on the results of comparing the second number with the three-quarter number.

In some embodiments, steps 2801–2804 are repeated every M periods of the input clock signal, where M is an integer. In some embodiments, M is five.

In some embodiments, the output clock signal has a predefined duty cycle. For example, the duty cycle of the output clock signal can be 50 percent, or some other value.

Figure 29:
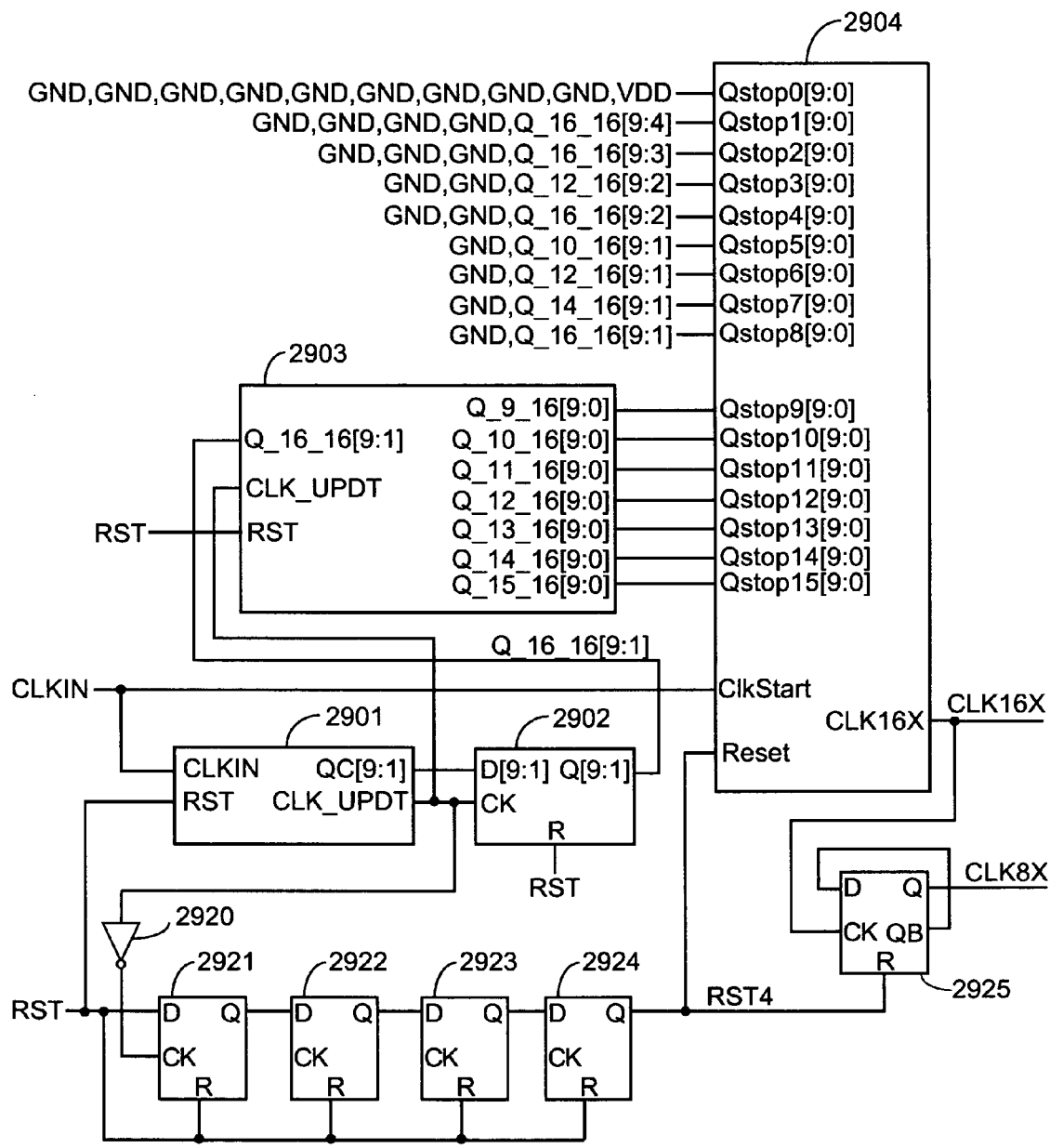
FIG. 29 is a schematic diagram of a 16× clock multiplier circuit implemented in a fashion similar to that illustrated in the preceding figures.

FIG. 29 is a schematic diagram of a 16× clock multiplier circuit implemented in a fashion similar to that illustrated in the preceding figures. The clock multiplier circuit of FIG. 29 includes a counter circuit 2901, a register 2902, a stop value generator circuit 2903, an output clock generator 2904, a duty cycle correction flip-flop 2925, and a reset circuit including elements 2920–2924, coupled together as shown in FIG. 29.

Counter circuit 2901 can be implemented in the same fashion as counter 601 of FIG. 6, for example. Register 2902 stores the counter value from counter circuit 2901, which is then provided to stop value generator circuit 2903. In the pictured embodiment, a number corresponding to half the counter value is stored in the register, i.e., the least significant bit is not stored, because the least significant bit is not used in stop value generator circuit 2903. However, in some embodiments the entire count value from counter circuit 2901 is stored and provided to stop value generator circuit 2903. Stop value generator circuit 2903 provides counter stop values Q_9_16[9:0] through Q_15_16[9:0] (Qstop9–Qstop15). Counter stop values Qstop0–Qstop8 are easily derived from these values, as shown in FIG. 29. Counter stop values Qstop0–Qstop15 correspond to a number of counts about 0/16, 1/16, . . . , 14/16, and 15/16 of the way through the input clock period, respectively. These stop values are used by output clock generator 2904 to provide pulses about 0/16, 1/16, . . . , 14/16, and 15/16 of the way through the input clock period on output clock signal CLK16X.

Because the output signal CLK16X has a duty cycle that is likely to be other than 50 percent, duty cycle correction flip-flop 2925 optionally corrects the duty cycle of the output signal to 50 percent. Clearly, the frequency of the flip-flop output signal CLK8X is half that of output clock signal CLK16X.

The reset circuit includes four reset flip-flops 2921–2924, coupled in series. Flip-flops 2921–2924 are clocked by the inverse (provided by inverter 2920) of the update clock signal CLK_UPDT from counter circuit 2901, and are reset by the reset signal RST. The reset circuit output signal RST4 resets the output clock generator 2904 and optional duty cycle correction flip-flop 2925.

Figure 30:
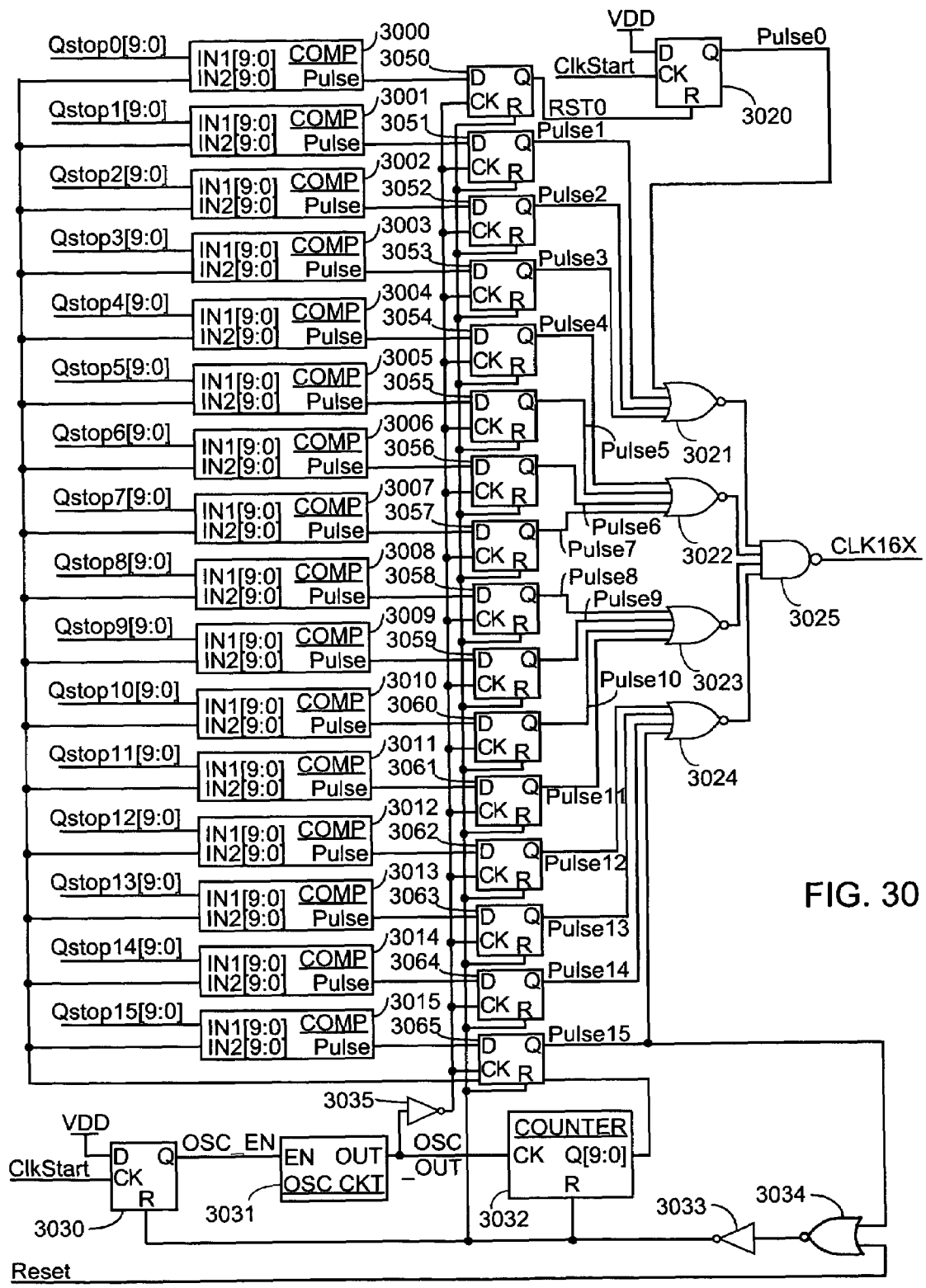
FIG. 30 is a schematic diagram of an output clock generator that can be used, for example, in the clock multiplier circuit of FIG. 29.

FIG. 30 is a schematic diagram of an output clock generator that can be used, for example, in the clock multiplier circuit of FIG. 29. The exemplary circuit of FIG. 30 includes a counter circuit including elements 3030–3034, comparators 3000–3015, flip-flops 3020 and 3050–3065, inverter 3035, NOR gates 3021–3024, and NAND gate 3025, coupled together as shown in FIG. 30.

The counter circuit is similar to that shown in FIG. 8, and functions in a similar fashion as that described in conjunction with that figure. The oscillator circuit 3031 preferably is implemented in the same fashion as the oscillator circuit in counter circuit 2901 of FIG. 29.

The output of counter 3032 is compared with each of the 16 stop values in 16 comparators 3000–3015. The comparator output values are stored in reset flip-flops 3050–3065. These flip-flops sample the comparator output signals on the falling edge of the oscillator output signal OSC_OUT, to prevent glitching that can occur when the output of counter 3032 is changing state. On a rising edge of clock signal ClkStart, the high value VDD is clocked into flip-flop 3020, and signal Pulse0 goes high, driving signal CLK16X high. When the value in counter 3032 is the same as counter stop value Qstop0[9:0] (e.g., 0000000001, see FIG. 29), a pulse is provided on signal RST0, which resets flip-flop 3020, and signal Pulse0 goes low again, followed by signal CLK16X. When the value in counter 3032 reaches the value Qstop1 [9:0], a high pulse is provided on signal Pulse1, which forces a high pulse onto signal CLK16X. Similarly, high pulses are provided on signal CLK16X when the value in counter 3032 reaches each of the successive counter stop values Qstop2–Qstop15.

Figure 31:
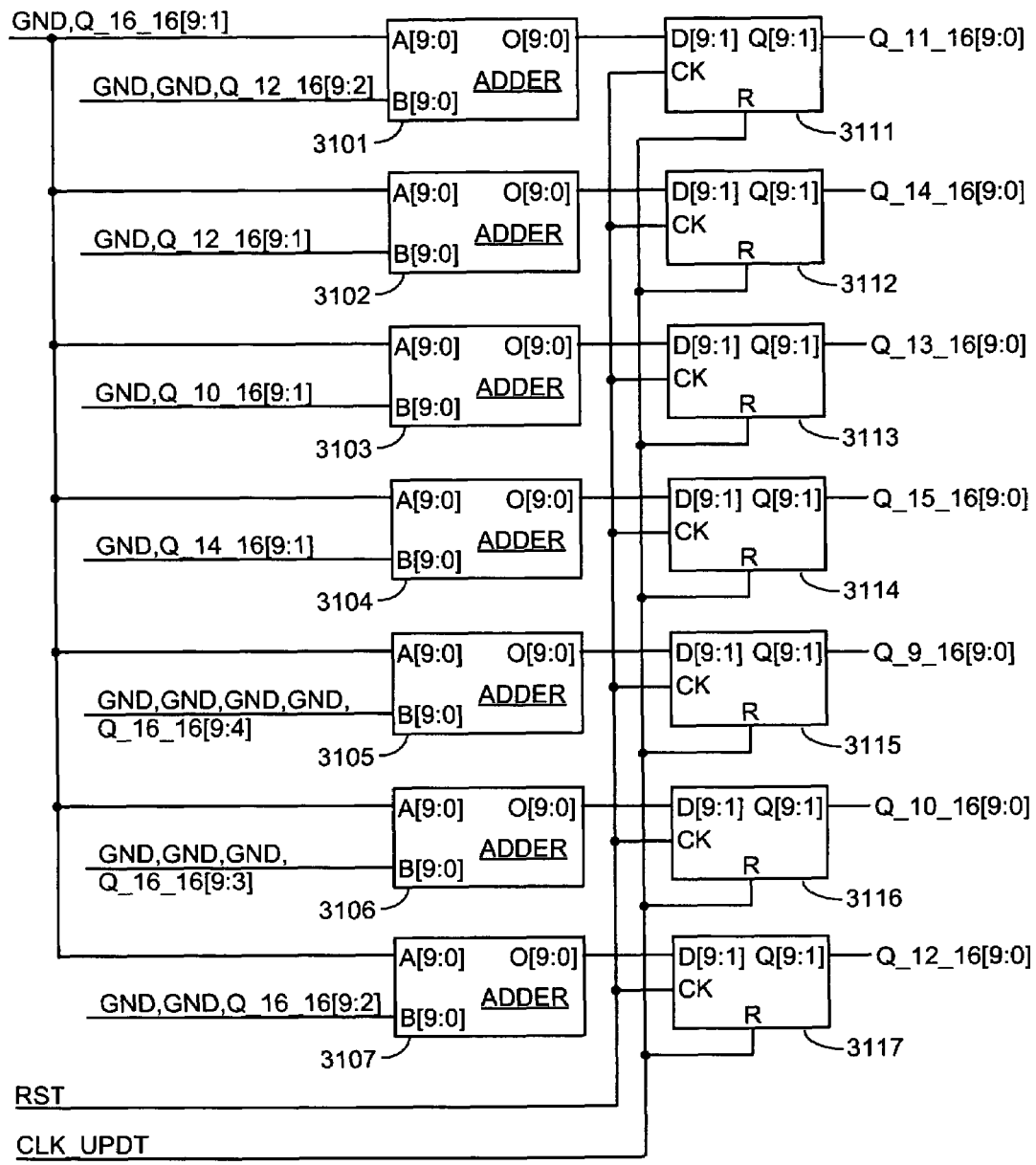
FIG. 31 is a schematic diagram of a stop value generator circuit that can be used, for example, in the clock multiplier circuit of FIG. 29.

FIG. 31 is a schematic diagram of a stop value generator circuit that can be used, for example, in the clock multiplier circuit of FIG. 29. The stop value generator circuit of FIG. 31 includes adders 3101–3107 and registers 3111–3117, coupled together as shown in FIG. 31. The signal names of the stop values are indicative of their function. For example, signal Q_11_16[9:0] represents a value corresponding to 11/16ths of the number of counts Q_16_16[9:0]. This value is obtained by adding, in adder 3101, the value GND,Q_16_16 [9:1] (half or 8/16ths the number of counts Q_16_16[9:0]) plus GND,GND,Q_12_16[9:2] (one-fourth the value of 12/16ths, or 3/16ths). The other counter stop values are obtained in a similar way by adding together appropriate values obtained from the number of counts Q_16_16[9:0].

Figure 32:
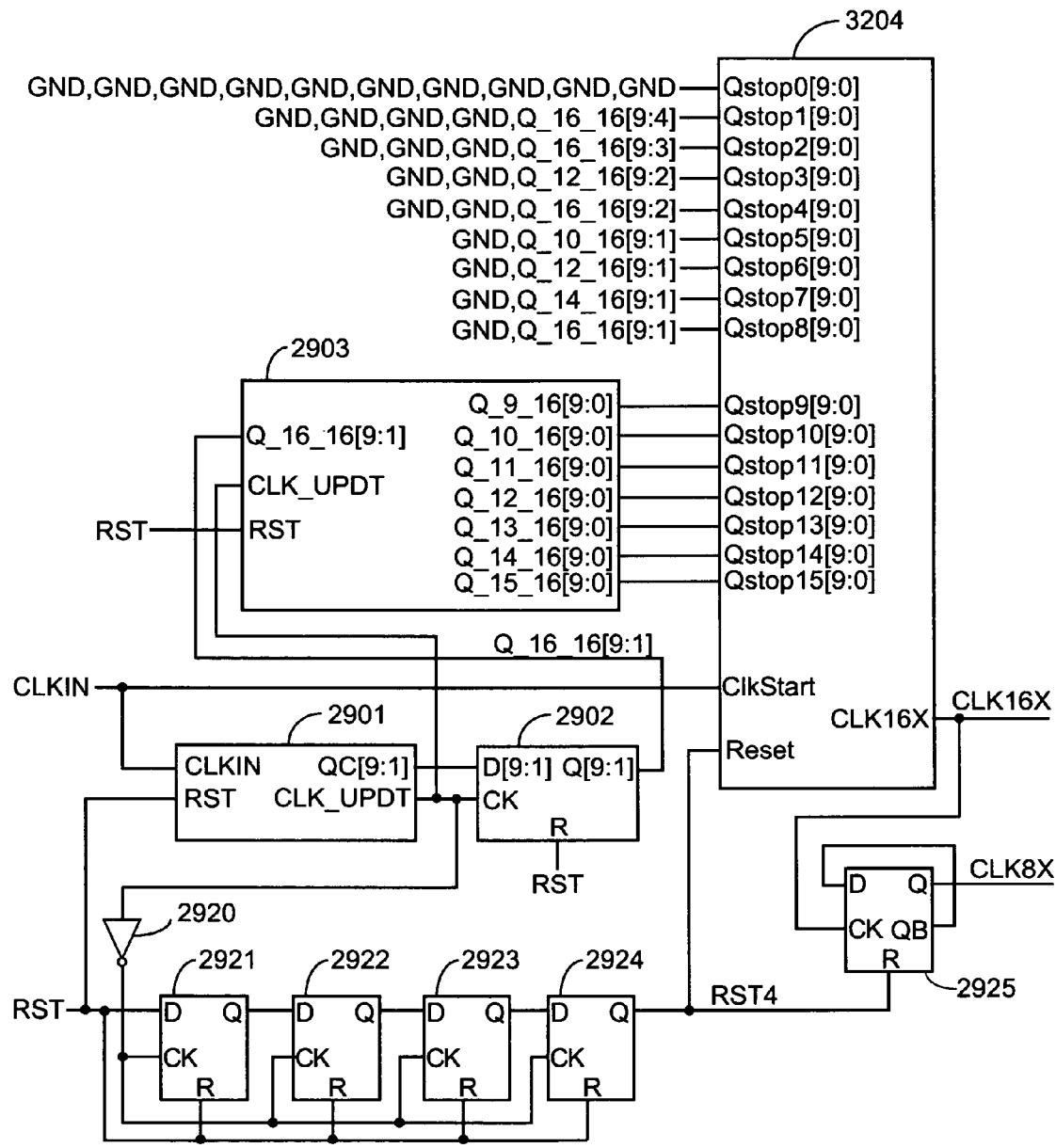
FIG. 32 is a schematic diagram of a 16× clock multiplier circuit implemented using fewer comparators than the circuit of FIG. 29, and providing output pulses with equal widths.

As can be seen from the circuit of FIG. 30, for example, the embodiment of FIGS. 29–31 results in a large circuit including sixteen 10-bit comparators. FIG. 32 is a schematic diagram of a 16× clock multiplier circuit implemented using fewer comparators and flip-flops than the circuit of FIG. 29. This embodiment also has the advantage of providing output pulses with equal widths. In the embodiment of FIGS. 29–31, the first pulse after the rising edge of the input clock signal is slightly shorter than the other output pulses. In contrast, in the embodiment of FIG. 32 all sixteen output pulses have equal widths.

The 16× clock multiplier circuit of FIG. 32 is similar in many ways to that of FIG. 29, and similar elements are not again described. A first difference between the two circuits is that Qstop0[9:0] has been changed to a value of all zeros. This difference provides the output pulses of equal widths. A second difference between the two circuits is that the output clock generator 3204 is implemented in a different fashion than output clock generator 2904, resulting in a significantly smaller circuit.

Figure 33:
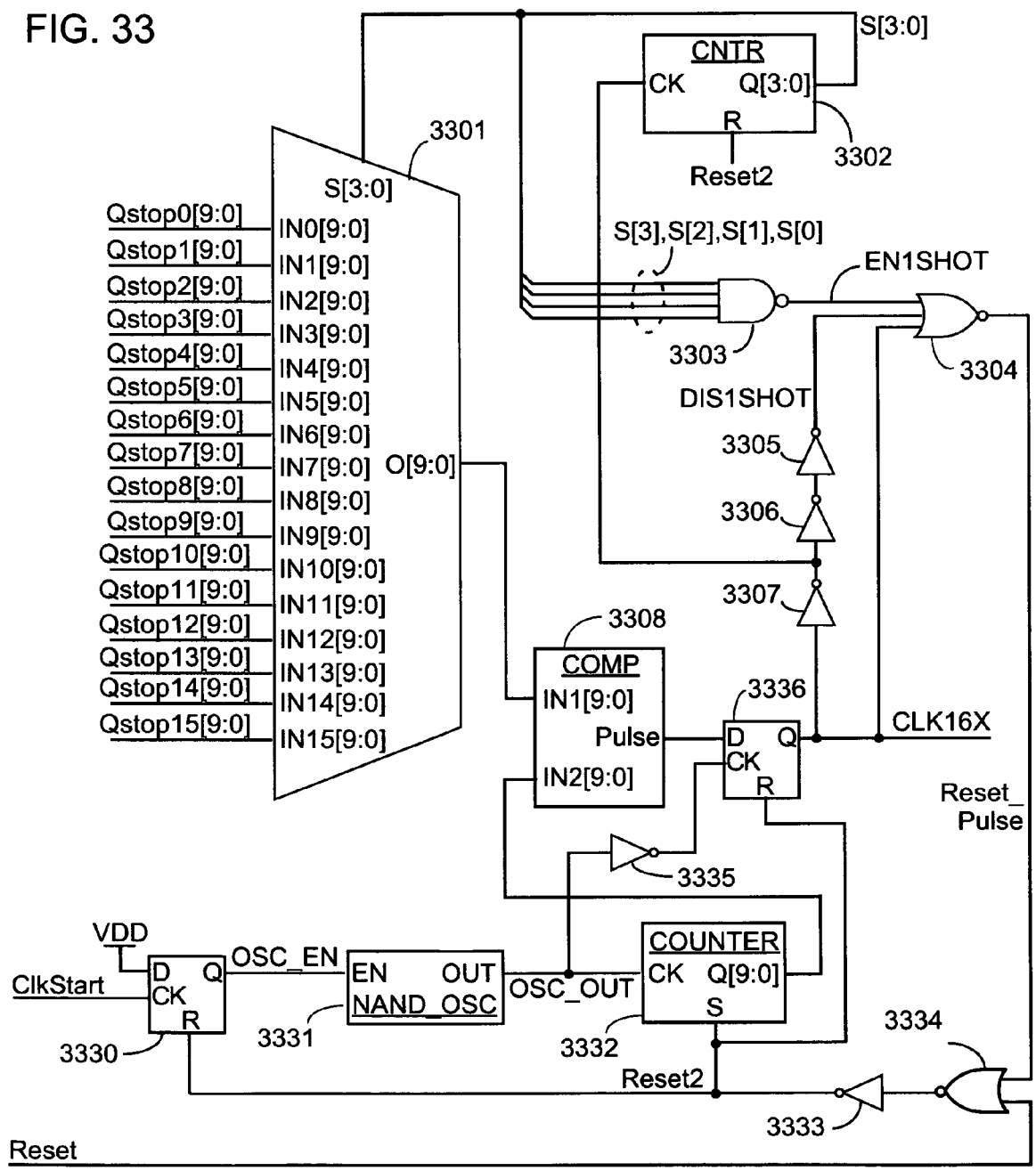
FIG. 33 is a schematic diagram of an output clock generator that can be used, for example, in the clock multiplier circuit of FIG. 32.

FIG. 33 is a schematic diagram of an output clock generator that can be used, for example, in the clock multiplier circuit of FIG. 32. The output clock generator of FIG. 33 includes 16-to-1 10-bit multiplexer 3301, 4-bit counter 3302, NAND gate 3303, NOR gate 3304, inverters 3305–3307 and 3335, comparator 3308, flip-flop 3336, and a counter circuit including elements 3330–3334, coupled together as shown in FIG. 33.

The counter circuit is the same as the counter circuit included in FIG. 30, and functions in the same manner. However, instead of comparing the count value to all sixteen counter stop values at the same time, 4-bit counter 3302 controls multiplexer 3301 to cycle through the sixteen counter stop values Qstop0–Qstop15 (IN0–IN15), comparing each of the counter stop values in turn to the value from counter 3332. As the count value reaches each stop value in turn, comparator 3308 provides a high pulse on the output clock signal CLK16X. The falling edge of each output pulse advances the value in counter 3302, selecting the next stop value to be compared with the value in counter 3332.

When counter 3302 reaches an all-ones value, the output of NAND gate 3303 goes low. When output signal CLK16X next changes from a high value to a low value, for a brief period signals CLK16X and DIS1SHOT are both low at the same time. Thus, NOR gate 3304 briefly drives signal Reset_Pulse high, and resets the counter circuit and counter 3302 via signal Reset2.

In the embodiment of FIG. 33, the reset path for the counter circuit utilizes three inverters 3305–3307 and a 3-input NOR gate 3304, driven by output clock signal CLK16X. Thus, the counter circuit is not reset until the next falling edge of signal CLK16X. In another embodiment (not shown), inverters 3305 and 3306 are omitted, and NOR gate 3304 is replaced by 2-input NOR gate driven by signal EN1SHOT and inverter 3307. In this embodiment, the counter circuit is reset shortly after signal CLK16X goes high, without waiting for the falling edge of signal CLK16X. Therefore, the final pulse on the output clock is typically shorter than the other fifteen pulses on signal CLK16X generated during the CLKIN clock period.

FIG. 34 is a schematic diagram of a first counter circuit that can be used, for example, to implement counter circuit 2901 in FIG. 32. The counter circuit of FIG. 34 includes set flip-flop 3425, reset flip-flops 3421–3424, NAND-based oscillator circuit 3426, and counter 3427. Flip-flops 3421–3425 are coupled in series, and serve to provide three non-overlapping clock pulses in the following repeating sequence: CLK_QP, CLK_UPDT, and RST_QP. Each of these signals is high for one clock cycle.

When signal RST is high, signal CLK_UPDT is low, because flip-flop 3424 is a reset flip-flop. Signal RST_QP is high, because flip-flop 3425 is a set flip-flop. Signal CLK_QP is low, because flip-flop 3422 is a reset flip-flop. Therefore, oscillator circuit 3426 (which has an active-high enable signal EN) is disabled. Upon signal RST going low, the first rising edge of signal CLKIN brings signal RST_QP low, releasing counter 3427 from the reset state. On the second rising edge of signal CLKIN, signal CLK_QP goes high, providing a high value on oscillator enable signal EN to oscillator circuit 3426. Thus, oscillator enable signal EN is high for one out of every five input clock cycles. Oscillator circuit 3426 generates a relatively fast oscillator output signal OUT (i.e., faster than input clock signal CLKIN) whenever signal EN is high. The oscillator output signal CLK_P is used by counter 3427 to measure the input clock period. Thus, in the pictured embodiment counter 3427 performs the counting process only during one input clock period out of each five input clock periods. On the fourth rising edge of signal CLKIN, signal CLK_UPDT goes high. On the fifth rising edge of signal CLKIN, signal RST_QP goes high again, resetting counter 3427 to an all zeroes value. The cycle then repeats each five clock cycles.

Note that the number of flip-flops coupled in series in the counter circuit determines the frequency with which the length of the input clock period is determined. For example, in the embodiment of FIG. 34, the period is measured every five clock cycles. By adding another reset flip-flop to the chain (e.g., in front of reset flip-flop 3421), the period would be measured every six clock cycles, and so forth. It will be clear to one of skill in the relevant arts that this selection is a matter of design choice.

FIG. 35 is a schematic diagram of a NAND-based oscillator circuit that can be used, for example, in the counter circuit of FIG. 34. The oscillator circuit of FIG. 35 includes NAND gate 3501 and inverters 3511–3522, coupled together as shown in FIG. 35. When oscillator enable signal EN is high, the value of oscillator output signal OUT travels through each of inverters 3512–3522 in turn, then through NAND gate 3501 and inverter 3511, thereby inverting the value of oscillator output signal OUT. This inversion repeats until signal EN goes low.

FIG. 36 is a schematic diagram of a second counter circuit that can be used, for example, in the clock multiplier circuit of FIG. 32. The counter circuit of FIG. 36 includes reset flip-flop 3623, set flip-flops 3621–3622 and 3624–3625, NOR-based oscillator circuit 3626, and counter 3627. Flip-flops 3621–3625 are coupled in series, and serve to provide three non-overlapping clock pulses in the following repeating sequence: CLK_QPB (a low pulse), CLK_UPDT (a high pulse), and SET_QP (a high pulse). Each of these pulses lasts for one clock cycle.

When signal RST is high, signal CLK_UPDT is low, because flip-flop 3622 is a set flip-flop. Signal SET_QP is high, because flip-flop 3623 is a reset flip-flop. Signal CLK_QPB is high, because flip-flop 3625 is a set flip-flop. Therefore, oscillator circuit 3626 (which has an active-low enable signal ENB) is disabled. Upon signal RST going low, the first rising edge of signal CLKIN brings signal SET_QP low, releasing counter 3627 from the set state. On the second rising edge of signal CLKIN, signal CLK_QPB goes low, providing a low value on oscillator enable signal ENB to oscillator circuit 3626. Thus, oscillator enable signal ENB is low for one out of every five input clock cycles. Oscillator circuit 3626 generates a relatively fast oscillator output signal OUT (i.e., faster than input clock signal CLKIN) whenever signal ENB is low. The oscillator output signal CLK_P is used by counter 3627 to measure the input clock period. Thus, in the pictured embodiment counter 3627 performs the counting process only during one input clock period out of each five input clock periods. On the fourth rising edge of signal CLKIN, signal CLK_UPDT goes high. On the fifth rising edge of signal CLKIN, signal SET_QP goes high again, setting counter 3627 to an all-ones value. The cycle then repeats each five clock cycles.

Note that the number of flip-flops coupled in series in the counter circuit determines the frequency with which the length of the input clock period is determined. For example, in the embodiment of FIG. 36, the period is measured every five clock cycles. By adding another set flip-flop to the chain (e.g., in front of set flip-flop 3625), the period would be measured every six clock cycles, and so forth. It will be clear to one of skill in the relevant arts that this selection is a matter of design choice.

FIG. 37 is a schematic diagram of a NOR-based oscillator circuit that can be used, for example, in the circuit of FIG. 36. The oscillator circuit of FIG. 37 includes NOR gate 3701 and inverters 3711–3722, coupled together as shown in FIG. 37. When oscillator enable signal ENB is low, the value of oscillator output signal OUT travels through each of inverters 3711–3722 in turn, then through NOR gate 3701, thereby inverting the value of oscillator output signal OUT. This inversion repeats until signal ENB goes high. Note that this circuit has a faster response time to the enable signal than the oscillator circuit of FIG. 35, because there is only one gate on the through-path from the enable signal to the oscillator output signal.

Note that when the NOR oscillator circuit of FIG. 37 and the counter circuit of FIG. 36 are used, the counter circuit shown in FIG. 33 is also preferably changed to use the same oscillator circuit, thereby maintaining the same timing between the two counter circuits.

Figure 38:
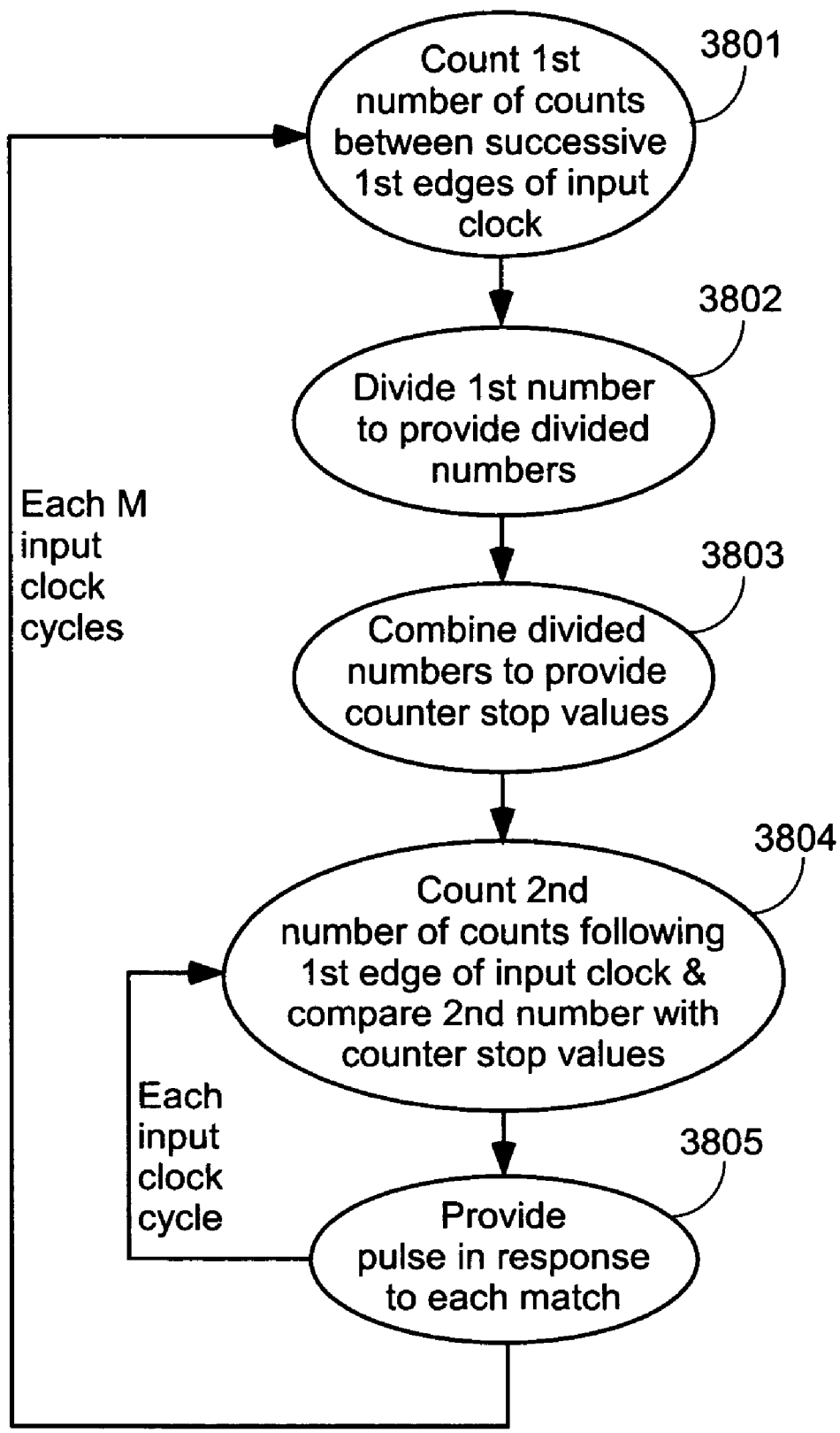
FIG. 38 illustrates the steps of a novel method of providing from an input clock signal an output clock signal having a higher frequency than the input clock signal, according to another embodiment of the invention.

FIG. 38 illustrates the steps of a novel method of providing from an input clock signal an output clock signal having a higher frequency than the input clock signal, according to another embodiment of the invention. In step 3801, a first number of counts between successive first edges of an input clock signal is counted. In some embodiments, the first edges are rising edges. In other embodiments, the first edges are falling edges. In step 3802, the first number is divided by two or more integers to provide two or more divided numbers. For example, the first number can be divided by two, four, eight, and sixteen. In some embodiments, the first number is stored, then is divided as it is passed to another circuit. In other embodiments, the number is divided prior to being stored in a register.

In step 3803, the divided numbers are combined (e.g., selectively added together) to provide two or more counter stop values. The counter stop values correspond to numbers of counts at various points in the input clock period. For example, in the embodiment of FIG. 32, counter stop values Qstop0–Qstop15 correspond to a number of counts about $0/16, 1/16, \ldots, 14/16,$ and $15/16$ of the way through the input clock period, respectively.

In step 3804, a second number of counts following each first edge of the input clock are counted, and the second number is compared with each of the counter stop values in turn. In step 3805, a pulse is provided on the output clock signal whenever the second number of counts corresponds to one of the counter stop values. Note that steps 3804 and 3805 occur simultaneously and/or in an alternating fashion.

In some embodiments, counting the first number of counts is repeated every M periods of the input clock signal, where M is an integer. In some embodiments, M is five.

Those having skill in the relevant arts of the invention will now perceive various modifications and additions that can be made as a result of the disclosure herein. For example, the above text describes the circuits and methods of the invention in the context of ICs such as programmable logic devices (PLDs). However, the circuits of the invention can also be implemented in other electronic systems, for example, in non-programmable integrated circuits, or in printed circuit boards including discrete devices.

As another example, the concepts of the invention can clearly be extended to provide clock multipliers multiplying by values other than those illustrated herein. As will be clear to those of skill in the relevant arts, by appropriately selecting the number and values of counter stop values, clock pulses can be generated as desired to provide an output clock signal using many different multipliers. For example, the multiplier values need not be powers of two, although using powers of two simplifies the logic of the circuit.

Further, inverters, logical OR gates, NOR gates, NAND gates, flip-flops, counters, oscillators, registers, output clock generators, reset circuits, dividers, adder/subtractors, adders, subtractors, reset circuits, multiplexers, comparators, and other components other than those described herein can be used to implement the invention. Active-high signals can be replaced with active-low signals by making straightforward alterations to the circuitry, such as are well known in the art of circuit design. Logical circuits can be replaced by their logical equivalents by appropriately inverting input and output signals, as is also well known.

Moreover, some components are shown directly connected to one another while others are shown connected via intermediate components. In each instance the method of interconnection establishes some desired electrical communication between two or more circuit nodes. Such communication can often be accomplished using a number of circuit configurations, as will be understood by those of skill in the art.

Accordingly, all such modifications and additions are deemed to be within the scope of the invention, which is to be limited only by the appended claims and their equivalents.

What is claimed is:

1. A system comprising a clock multiplier circuit, the clock multiplier circuit comprising:
   a counter circuit having a clock input terminal, a clock output terminal, and a plurality of count output terminals;
   a register having a plurality of data input terminals coupled to the count output terminals of the counter circuit, a clock input terminal coupled to the clock output terminal of the counter circuit, and a plurality of output terminals;
   a stop value generator circuit having a plurality of data input terminals coupled to the output terminals of the register, a clock input terminal coupled to the clock output terminal of the counter circuit, and a plurality of output terminals; and
   an output clock generator having a plurality of input terminals coupled to the output terminals of the stop value generator circuit, a clock input terminal coupled to the clock input terminal of the counter circuit, and a clock output terminal.

2. The system of claim 1, wherein the counter circuit comprises:
   a first oscillator circuit having an input terminal coupled to the clock input terminal of the counter circuit and further having an output terminal; and
   a first counter having an input terminal coupled to the output terminal of the first oscillator circuit and further having a plurality of output terminals coupled to the count output terminals of the counter circuit.

3. The system of claim 2, wherein the output clock generator comprises:
    a second oscillator circuit having an input terminal coupled to the clock input terminal of the output clock generator and further having an output terminal, the second oscillator circuit being implemented to oscillate with the same frequency as the first oscillator circuit; and
    a second counter having an input terminal coupled to the output terminal of the oscillator circuit and further having a plurality of output terminals.

4. The system of claim 3, wherein the output clock generator further comprises:
    a multiplexer circuit having a plurality of data input terminals coupled to the output terminals of the stop value generator circuit, a plurality of select input terminals, and a plurality of output terminals;
    a comparator having a first set of input terminals coupled to the output terminals of the multiplexer circuit, a second set of input terminals coupled to the output terminals of the second counter, and an output terminal coupled to the clock output terminal of the output clock generator; and
    a third counter having a clock input terminal coupled to the output terminal of the comparator and a plurality of output terminals coupled to the select input terminals of the multiplexer circuit.

5. The system of claim 1, wherein the clock multiplier circuit further comprises a reset input terminal coupled to reset input terminals of the counter circuit, the register, the stop value generator circuit, and the output clock generator.

6. The system of claim 1, wherein the counter circuit comprises means for resetting itself after each M input clock periods, wherein M is an integer.

7. The system of claim 6, wherein M is five.

8. The system of claim 1, wherein the system comprises a programmable logic device (PLD), and the clock multiplier circuit is implemented using programmable logic of the PLD.

9. The system of claim 8, wherein the PLD comprises a field programmable gate array (FPGA).

10. A method of providing from an input clock signal an output clock signal having a higher frequency than the input clock signal, the method comprising:
    counting a first number of counts between successive first edges of the input clock signal;
    dividing the first number by a plurality of integers to provide a plurality of divided numbers;
    combining the plurality of divided numbers to provide a plurality of counter stop values;
    counting a second number of counts following each first edge of the input clock signal and comparing the second number of counts with each counter stop value in turn; and
    providing a pulse on the output clock signal when the second number of counts corresponds to one of the counter stop values.

11. The method of claim 10, wherein the counting the first number of counts is repeated every M periods of the input clock signal, wherein M is an integer.

12. The method of claim 11, wherein M is five.

13. The method of claim 10, wherein the steps of the method are performed by a circuit implemented in a programmable logic device (PLD).

14. The method of claim 13, wherein the PLD comprises a field programmable gate array (FPGA).

15. The method of claim 10, wherein the first edges are rising edges.

16. The method of claim 10, wherein the output clock signal has a 50 percent duty cycle.

17. A system providing from an input clock signal an output clock signal having a higher frequency than the input clock signal, the system comprising:
    means for counting a first number of counts between successive first edges of the input clock signal;
    means for dividing the first number by a plurality of integers to provide a plurality of divided numbers;
    means for combining the plurality of divided numbers to provide a plurality of counter stop values;
    means for counting a second number of counts following each first edge of the input clock signal and comparing the second number of counts with each counter stop value in turn; and
    means for providing a pulse on the output clock signal when the second number of counts corresponds to one of the counter stop values.

18. The system of claim 17, further comprising means for resetting the means for counting the first number of counts, the means for dividing, the means for combining, the means for counting the second number of counts, and the means for providing the pulse.

19. The system of claim 17, wherein the means for counting the first number of counts comprises means for resetting itself after each M input clock periods, wherein M is an integer.

20. The system of claim 19, wherein M is five.

* * * * *